United States Patent
He et al.

(10) Patent No.: US 11,201,254 B2
(45) Date of Patent: Dec. 14, 2021

(54) $(GAME)_2O_3$ TERNARY ALLOY MATERIAL, ITS PREPARATION METHOD AND APPLICATION IN SOLAR-BLIND ULTRAVIOLET PHOTODETECTOR

(71) Applicants: HUBEI UNIVERSITY, Hubei (CN); Wuhan RuiLian ZhiChuang optoelectronic Co Ltd., Hubei (CN)

(72) Inventors: Yunbin He, Hubei (CN); Mingkai Li, Hubei (CN); Pan Huang, Hubei (CN); Qile Wang, Hubei (CN); Yinmei Lu, Hubei (CN); Gang Chang, Hubei (CN); Pai Li, Hubei (CN)

(73) Assignee: HUBEI UNIVERSITY, Hubei (CN)

( * ) Notice: Subject to any disclaimer, the term of this patent is extended or adjusted under 35 U.S.C. 154(b) by 30 days.

(21) Appl. No.: 16/855,931

(22) Filed: Apr. 22, 2020

(65) Prior Publication Data
US 2020/0287067 A1    Sep. 10, 2020

(30) Foreign Application Priority Data

Apr. 22, 2019  (CN) .......................... 201910324339.X
Apr. 22, 2019  (CN) .......................... 201910344454.3
Feb. 18, 2020  (CN) .......................... 202010099288.8

(51) Int. Cl.
*C22C 29/12*   (2006.01)
*H01L 31/032*  (2006.01)
*H01L 31/18*   (2006.01)
*H01L 31/108*  (2006.01)

(52) U.S. Cl.
CPC ............ *H01L 31/032* (2013.01); *C22C 29/12* (2013.01); *H01L 31/1085* (2013.01); *H01L 31/18* (2013.01)

(58) Field of Classification Search
None
See application file for complete search history.

(56) References Cited

FOREIGN PATENT DOCUMENTS

DE          102020201617       *  8/2021

OTHER PUBLICATIONS

"(Y1—xBix)3(Fe1—yGay)5O12 Solid Solution Region in the Ieneke Diagram" by Smirnova et al. (Year: 2018).*

* cited by examiner

*Primary Examiner* — Evren Seven

(57) ABSTRACT

A $(GaMe)_2O_3$ ternary alloy material, its preparation method and application in a solar-blind ultraviolet photodetector are provided. The $(GaMe)_2O_3$ ternary alloy material of the present invention is formed by solid solution of $Ga_2O_3$ and $Me_2O_3$ in a molar ratio of 99:1 to 50:50, wherein the Me is any one of Lu, Sc, or Y. The $(GaMe)_2O_3$ ternary alloy material of the present invention can be used to prepare the active layer of a solar-blind ultraviolet photodetector. In the present invention, the band gap of $Me_2O_3$ is higher than that of $Ga_2O_3$, and $Ga^{3+}$ ions in $Ga_2O_3$ are partially replaced by $Me^{3+}$ ions to obtain a higher band gap $(GaMe)_2O_3$ ternary alloy material to reduce the dark current of the device and promote the blue shift of the cut-off wavelength to within 280 nm.

4 Claims, 19 Drawing Sheets

(GAME)$_2$O$_3$ TERNARY ALLOY MATERIAL, ITS PREPARATION METHOD AND APPLICATION IN SOLAR-BLIND ULTRAVIOLET PHOTODETECTOR

CROSS REFERENCE OF RELATED APPLICATION

The present application claims priority under 35 U.S.C. 119(a-d) to CN 201910324339.X, filed Apr. 22, 2019; 201910344454.3, filed Apr. 22, 2019; and CN202010099288.8, filed Feb. 18, 2020.

BACKGROUND OF THE PRESENT INVENTION

Field of Invention

The present invention belongs to the technical field of inorganic semiconductor materials, and more particular relates to a (GaMe)$_2$O$_3$ ternary alloy material, its preparation method and application in a solar-blind ultraviolet (UV) photodetector.

Description of Related Arts

Since the deep ultraviolet part (200-280 nm) in sunlight will be strongly absorbed by the ozone layer before reaching the earth's surface, the solar-blind ultraviolet photodetector has the characteristics of strong anti-interference ability and high sensitivity when working on the earth's surface. The traditional vacuum ultraviolet photomultiplier tube photodetector has high power consumption and high price. Due to the characteristics of small size, large gain and low energy consumption, solar-blind ultraviolet photodetectors based on wide band gap semiconductor materials have become the research and competition hot spot of countries around the world. The research focuses on MgZnO, AlGaN and Ga$_2$O$_3$ wide band gap semiconductor materials. However, to achieve solar-blind solar detection, the active layer semiconductor material must have a band gap greater than 4.4 eV. While the band gap of MgZnO and AlGaN can be increased to 4.4 eV by increasing the Mg and Al content, respectively, this degrades the crystal quality significantly. The decline of crystal quality will greatly reduce the performance and stability of the device.

SUMMARY OF THE PRESENT INVENTION

Ga$_2$O$_3$ is a semiconductor material with a direct band gap of 4.9 eV, and has high exciton binding energy. It has good physical and chemical stability and is an ideal material for solar-blind UV detection. Although the peak response wavelength of pure gallium oxide-based solar-blind UV photodetectors is around 255 nm, its cut-off wavelength is greater than 280 nm, which means that it still has an obvious response to ultraviolet light in the UVB band (280~315 nm). And because deep ultraviolet light is relatively weak, reducing the dark current of the device can effectively reduce the impact of noise on signal detection.

Based on the above reasons, we designed to introduce Me$_2$O$_3$ in Ga$_2$O$_3$ with an energy band gap ($\geq$5.5 eV) higher than the Ga$_2$O$_3$ band gap (4.9 eV) (where Me$_2$O$_3$ is Lu$_2$O$_3$, Sc$_2$O$_3$, or Y$_2$O$_3$), and partially replace Ga$^{3+}$ ions in Ga$_2$O$_3$ with Me$^{3+}$ ions, to obtain a higher bandgap (GaMe)$_2$O$_3$ ternary alloy. The higher band gap of (GaMe)$_2$O$_3$ ternary alloy than Ga$_2$O$_3$ can effectively reduce the dark current of the (GaMe)$_2$O$_3$ ternary alloy-based device and make the cut-off wavelength blue shifted to within 280 nm; In addition, due to stronger Me-O bond than Ga—O bond, the addition of Me$^{3+}$ is beneficial to reduce the concentration of oxygen vacancies, thereby improving the response speed and increasing the detection ability of the (GaMe)$_2$O$_3$ ternary alloy-based device to deep ultraviolet light.

At the same time, the metal-semiconductor-metal (MSM) structure photodetector is particularly beneficial to surface light absorption, has the advantages of simple structure, high efficiency and easy integration, and good control the photodetector performance by adjusting structure parameters such as metal type and channel width. Therefore, we chose to prepare an MSM type (GaMe)$_2$O$_3$ ternary alloy-based solar-blind ultraviolet photodetector.

The object of the present invention is to provide a (GaMe)$_2$O$_3$ ternary alloy material and its preparation method and application in a solar-blind ultraviolet photodetector.

The invention provides a method to increase the band gap of the gallium oxide material by doping with Me$^{3+}$ ions (Me$^{3+}$ ions are Lu$^{3+}$ ions, Sc$^{3+}$ ions or Y$^{3+}$ ions), so that the dark current of the gallium oxide alloy based solar-blind ultraviolet photodetector is reduced, and the cut-off wavelength is blue shifted improving the ability to detect deep ultraviolet light.

In order to achieve the above first object, the present invention adopts the following technical solutions:

A (GaMe)$_2$O$_3$ ternary alloy material is formed by solid solution of Ga$_2$O$_3$ and Me$_2$O$_3$ in a molar ratio of 99:1 to 50:50, wherein: Me is any one of Lu, Sc or Y.

Further, in the above technical solution, the molar ratio of Ga$_2$O$_3$ and Me$_2$O$_3$ is preferably 95:5 to 70:30.

The second object of the present invention is to provide a method for preparing the (GaMe)$_2$O$_3$ ternary alloy material described above. The method is as follows:

(A) Weigh the Ga$_2$O$_3$ and Me$_2$O$_3$ powders in proportion, place the powders in a ball milling tank, add ultrapure water and perform ball milling to obtain a uniformly mixed powder;

(B) The mixed powder solution described in step (A), after screening out the zirconia balls, is placed in a vacuum drying oven. After drying, it is cooled to room temperature, then crushed and pressed into a wafer;

(C) In an air atmosphere, place the powder wafers obtained in step (B) in a vacuum tube furnace and sinter at 1000° C. to 1500° C. for 1 to 4 hours to obtain the (GaMe)$_2$O$_3$ ternary alloy material.

Further, in the above technical solution, the temperature of the vacuum drying oven in step (B) is 100° C.-120° C., and the drying time is 10 h-12 h.

The third object of the present invention is to provide the application of the aforementioned (GaMe)$_2$O$_3$ ternary alloy material in a solar-blind ultraviolet photodetector.

The fourth object of the present invention is to provide a solar-blind photodetector based on (GaMe)$_2$O$_3$ ternary alloy, the photodetector includes a hard substrate, an active layer, and a pair of parallel metal electrodes in the order from bottom to top, Wherein: the active layer is a (GaMe)$_2$O$_3$ ternary alloy film, and the (GaMe)$_2$O$_3$ ternary alloy film is formed by depositing the (GaMe)$_2$O$_3$ ternary alloy material described above.

Further, in the above technical solution, the hard substrate is a sapphire substrate or an MgO substrate.

Specifically, in the above technical solution, the sapphire substrate may be a commercially available ordinary sapphire substrate of any crystal orientation, such as any one of a c-plane sapphire substrate, an a-plane sapphire substrate, an r-plane sapphire substrate, etc.

Further, in the above technical solution, the thickness of the active layer is 150-300 nm.

Further, in the above technical solution, the thickness of the parallel metal electrode is 30 nm-70 nm.

Further, in the above technical solution, the spacing of the parallel metal electrodes is 10 μm-100 μm.

Further, in the above technical solution, the parallel metal electrode material may be any one of Pt, Au, Al, or ITO, preferably Au.

The fifth object of the present invention is to provide a method for preparing the above-mentioned $(GaMe)_2O_3$ ternary alloy-based solar-blind ultraviolet photodetector, which includes the following steps:

(1) Using a hard substrate for film growth, ultrasonically clean the hard substrate with a cleaning solution, blow dry with nitrogen, and then immediately place it in a vacuum chamber;

(2) Using $(GaMe)_2O_3$ ternary alloy material as the target/source material, using pulsed laser deposition, magnetron sputtering or electron beam evaporation to form $(GaMe)_2O_3$ alloy film on the surface of the hard substrate after step (1) pretreatment;

(3) Prepare a pair of parallel metal electrodes on the surface of the $(GaMe)_2O_3$ ternary alloy film by evaporation, photolithography or sputtering to obtain the $(GaMe)_2O_3$ ternary alloy-based solar-blind UV photodetector.

Further, in the above technical solution, the cleaning solution in step (1) includes acetone, ethanol, and deionized water, and the ultrasonic cleaning time of each cleaning solution is preferably 15 min.

Further, in the above technical solution, the $(GaMe)_2O_3$ ternary alloy film described in step (2) is specifically made by a pulsed laser deposition method, and the specific process is as follows:

Using $(GaMe)_2O_3$ ternary alloy material as the target, controlling the substrate temperature to 300-800° C., pulsed laser energy to 200-600 mJ/Pulse, oxygen pressure to 1-8 Pa, deposit $(GaMe)_2O_3$ ternary alloy thin film on the surface of the hard substrate that is pretreated in step (1).

Preferably, in the above technical solution, the deposition time is 10 to 60 minutes.

The principle of the present invention is as follows:

In the present invention, the band gap Eg of $Me_2O_3$ (where $Me_2O_3$ is $Lu_2O_3$, $Sc_2O_3$ or $Y_2O_3$) ($Eg_{Lu2O3}$=5.5 eV, $Eg_{Sc2O3}$=5.9 eV, $Eg_{Y2O3}$=5.6 eV) is higher than that of $Ga_2O_3$ (4.9 eV). Since the $Ga^{3+}$ ion in $Ga_2O_3$ is partially replaced by $Me^{3+}$, a higher band gap $(GaMe)_2O_3$ ternary alloy is obtained to reduce the dark current of the device, and at the same time, the cut-off wavelength is blue shifted to within 280 nm, which improves the detection ability of the device to deep ultraviolet light.

The beneficial effects of the present invention are as follows:

1. The present invention partially replaces $Ga^{3+}$ ions in $Ga_2O_3$ with $Me^{3+}$ ions to obtain $(GaMe)_2O_3$ ternary alloy, which can significantly increase the band gap of $Ga_2O_3$.

2. The carrier concentration in the $(GaMe)_2O_3$ alloy film with higher band gap of the invention is lower, which can effectively reduce the dark current of its solar-blind ultraviolet photodetector, and can make the cut-off wavelength blue shifted. Meanwhile, the stronger bonding of Me-O than Ga-O reduces the concentration of oxygen vacancy defects (trap centers) in $(GaMe)_2O_3$ film, improves the response speed of its photodetector, and significantly enhances the detection ability of deep ultraviolet light.

3. The $(GaMe)_2O_3$ ternary alloy film in the present invention can be grown by conventional pulsed laser deposition, magnetron sputtering, electron beam evaporation and other methods. The electrode material can be metal aluminum, gold, platinum etc or transparent electrode ITO, and electrode shape and channel width can be freely adjusted and optimized. The electrode of the present invention may be deposited by evaporation, or may be produced by photolithography or sputtering. The evaporation method is simple and convenient for large-scale preparation; the photolithography method is very conducive to the development of high-precision and micro-sized devices.

4. The solar-blind photodetector based on $(GaMe)_2O_3$ ternary alloy produced by the present invention has a simple structure and manufacturing process. In addition, the photodetector produced by the present invention has good detection ability for deep ultraviolet light, with extremely low dark current (less than 0.2 pA), fast response and stable performance.

DETAILED DESCRIPTION OF THE PREFERRED EMBODIMENT

Figure 1:
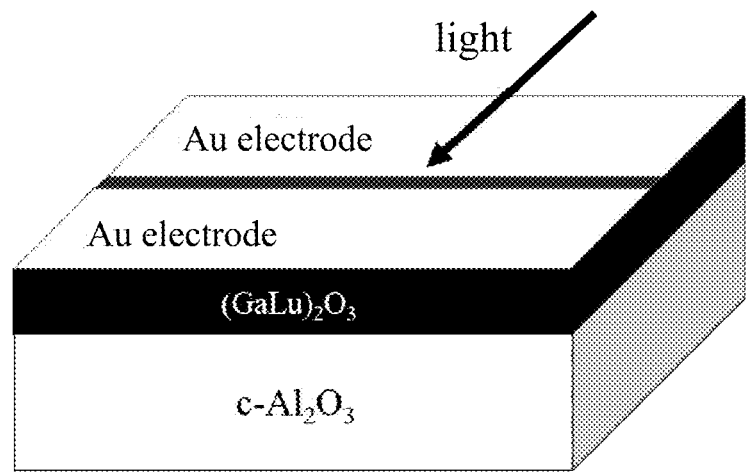
FIG. 1 is a schematic structural diagram of a solar-blind ultraviolet photodetector based on $(GaLu)_2O_3$ ternary alloy in Example 1 of the present invention.

The embodiments of the present invention will be described in detail below with reference to the drawings. This embodiment case is implemented on the premise of the technical solution of the present invention, and a detailed embodiment and a specific operation process are given, but the protection scope of the present invention is not limited to the following embodiment cases.

The main components of the sapphire substrate used in the following embodiments of the present invention is alumina ($Al_2O_3$); wherein $c-Al_2O_3$ represents c-plane sapphire, and $m-Al_2O_3$ represents m-plane sapphire. A thickness of the sapphire substrate in the present invention is preferably 0.35 to 0.45 mm.

The light-dark current ratio ($I_{light}/I_{dark}$) and the detection rate (D*) involved in the following embodiments of the present invention are calculated by the I-V and I-t test results, and the detection rate is calculated according to a peak wavelength of the responsivity. The calculation formula is as follows:

$$D^* = \frac{RS^{1/2}}{(2qI_{dark})^{1/2}},$$

where R refers to a peak responsivity, S refers to a photo-sensitive area of the photodetector, $I_{dark}$ refers to a dark current, and q refers to an electron charge.

Example 1

A (GaLu)₂O₃ ternary alloy material of this embodiment is made of Ga₂O₃ powder and Lu₂O₃ powder with a molar ratio of 70:30 by solid phase sintering. The specific method is as follows:

1.1 According to the molar ratio of Ga₂O₃:Lu₂O₃=70:30, weigh 5.236 g of Ga₂O₃ powder and 4.963 g of Lu₂O₃ powder, after mixing, add 15 g of deionized water, and then put in a ball mill tank of planetary ball mill wherein ball milling media are zirconia ceramic balls, ball mill for 4 h to obtain mixed powder;

1.2 Sieve the mixed powder to remove the zirconia balls, place in a vacuum drying oven, vacuum dry at 110° C. for 12 h, take it out and cool to a room temperature, add 1 g of deionized water, and grind thoroughly with a mortar, and then press with a tablet press at 8 M Pa pressure to form a wafer with a diameter of 27.5 mm and a thickness of 2 mm;

1.3 Place the wafer into a crucible in a vacuum tube furnace and place a powder (15.000 g) of an identical composition around the wafer, Heat the tube furnace to 1300° C. and hold for 3 hours, and then naturally cool to a room temperature to obtain the (GaLu)₂O₃ ternary alloy material.

The (GaLu)₂O₃ ternary alloy material described in this embodiment is used to prepare a solar-blind ultraviolet photodetector. As shown in FIG. 1, a solar-blind ultraviolet photodetector based on (GaLu)₂O₃ ternary alloy in this embodiment includes a c-plane sapphire substrate, an active layer, and a pair of parallel Metal Au electrodes, wherein: the active layer is (−201) oriented (GaLu)₂O₃ ternary alloy film, and the (−201) oriented (GaLu)₂O₃ ternary alloy film is deposited using the (GaLu)₂O₃ ternary alloy material; the thickness of the c-plane sapphire substrate is 0.43 mm, the thickness of the active layer is 150 nm, the thickness of the parallel metal Au electrode is 50 nm, and the spacing of the parallel metal Au electrodes is 10 μm.

The solar-blind photodetector based on (GaLu)₂O₃ ternary alloy described above in this embodiment is prepared by the following method, including the following steps:

2.1 Using the (GaLu)₂O₃ ternary alloy material prepared in step 1.3 as a laser ablation target, it was loaded into a vacuum chamber together with a sapphire substrate that was ultrasonically cleaned for 15 min with acetone, absolute ethanol, and deionized water, respectively, and pump the chamber down to $10^{-4}$ Pa;

2.2 After the substrate temperature is raised to 700° C., oxygen is introduced to maintain the gas pressure at 4 Pa during the entire film deposition process; then the substrate and target are set to rotate, and the laser output energy and pulse repetition frequency are set to 300 mJ/pulse and 5 Hz, respectively, and then the laser is turned on to start depositing (GaLu)₂O₃ ternary alloy thin film. After 30 minutes of deposition, the oxygen and heating were turned off, and finally the sample was naturally cooled to room temperature in a vacuum and taken out;

2.3 Place the obtained (GaLu)₂O₃ ternary alloy film on the mask plate and install it in the vacuum chamber of the vacuum evaporation machine, then install the tungsten boat and feed it with the evaporation source—metal Au 0.15 g, close the vacuum chamber, and turn on the mechanical pump, fore-stage valve, molecular pump, and pump the chamber to below $10^{-4}$ Pa. Then turn on the evaporation power, slowly increase the current until the metal Au melts, and then keep the current constant and open the baffle to start evaporation. After the metal Au is evaporated, the current is slowly reduced, the evaporation source is closed, the molecular pump, the fore-stage valve, and the mechanical pump are turned off, and then the air valve is opened to flow air into the chamber. Finally the solar-blind ultraviolet photodetector based on the $(GaLu)_2O_3$ ternary alloy is obtained.

Figure 2:
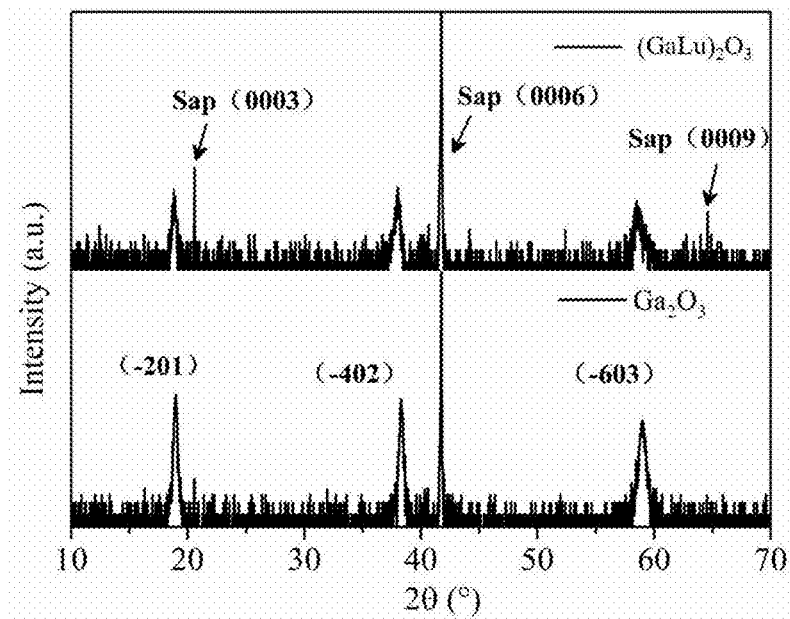
FIG. 2 is a comparison chart of X-ray diffraction (XRD) of the $(GaLu)_2O_3$ film in Example 1 of the present invention and the pure $Ga_2O_3$ film in Comparative Example 1.

The XRD survey-scan spectrum of the $(GaLu)_2O_3$ ternary alloy thin film prepared in this example is shown in FIG. 2. It can be seen that in addition to the (0003), (0006) and (0009) three diffraction peaks of the c-plane sapphire substrate, there are and only three diffraction peaks, which are located near 18.9°, 38.3° and 59.1°, respectively. The standard XRD spectrum (JCPDS File No. 41-1103) shows that these three diffraction peaks correspond to the (−201), (−402), and (−603) crystal planes of $Ga_2O_3$, respectively, indicating that (−201) oriented $(GaLu)_2O_3$ ternary alloy thin film was successfully prepared in this example.

Figure 3:
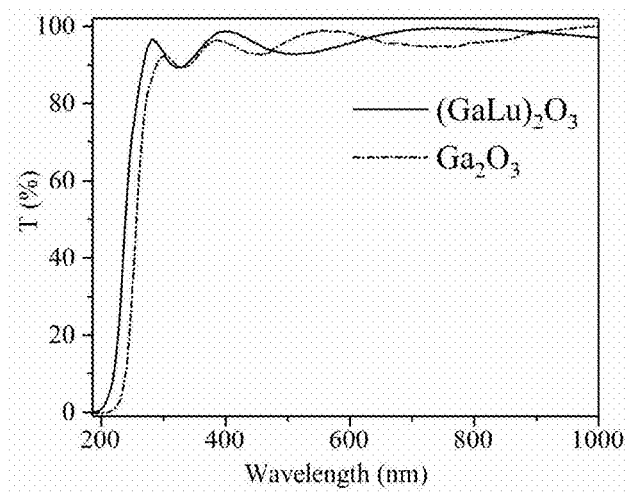
FIG. 3 is a transmission spectrum diagram of the $(GaLu)_2O_3$ ternary alloy film in Example 1 of the present invention vs. the pure $Ga_2O_3$ film in Comparative Example 1.
Figure 4:
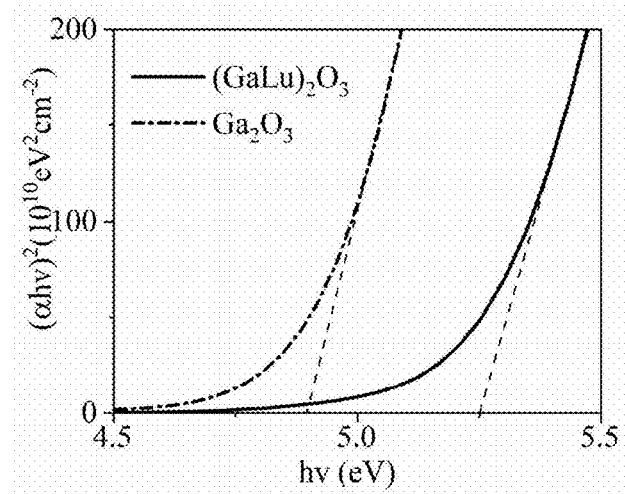
FIG. 4 is a $(\alpha hv)^2$-hv relationship diagram of the $(GaLu)_2O_3$ ternary alloy film in Example 1 of the present invention vs. the pure $Ga_2O_3$ film in Comparative Example 1.

FIG. 3 shows the transmission spectra of $(GaLu)_2O_3$ and pure $Ga_2O_3$. As shown in FIG. 3, the transmittance of $(GaLu)_2O_3$ and pure $Ga_2O_3$ in the infrared and visible light regions are both above 90%. The absorption edge of $(GaLu)_2O_3$ thin film is near 235 nm, which is obviously blue-shifted with respect to the absorption edge (~255 nm) of pure $Ga_2O_3$ thin film. Because gallium oxide is a direct band gap semiconductor, the band gap Eg of the thin film can be obtained by the relationship $(\alpha h v)^2 \propto (h v - E g)$, where hv represents the incident photon energy and a represents the absorption coefficient. The curve of $(\alpha h v)^2$ vs. hv is shown in FIG. 4. By linear extrapolation, the band gap of $(GaLu)_2O_3$ film is estimated as 5.2 eV, while the band gap of pure $Ga_2O_3$ is 4.9 eV. It can be seen that the doping of Lu can significantly increase the band gap of gallium oxide. This is because the band gap of $Lu_2O_3$ (5.5 eV) is larger than that of $Ga_2O_3$ (4.9 eV).

Figure 5:
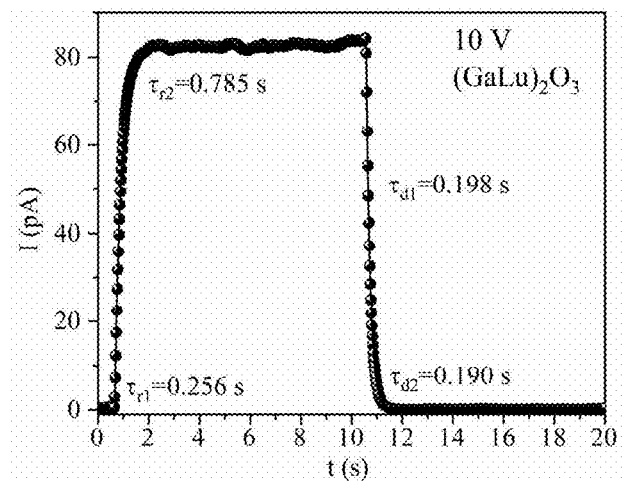
FIG. 5 is a graph of time t-current I response of a solar-blind UV photodetector based on $(GaLu)_2O_3$ ternary alloy in Example 1 of the present invention.
Figure 7:
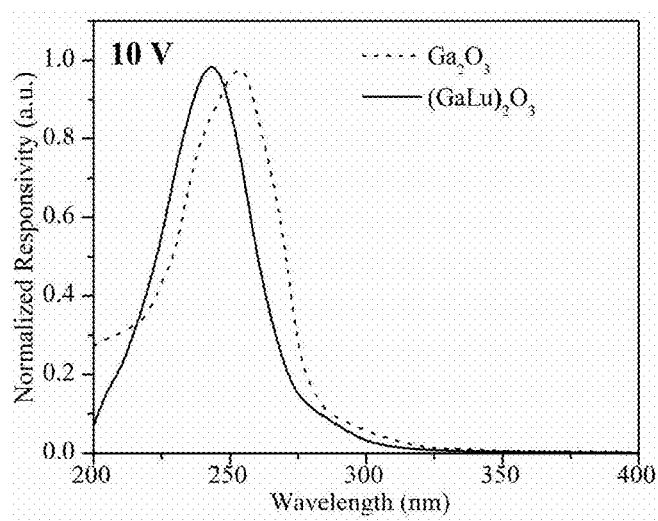
FIG. 7 is a comparison diagram of the spectral responsivity test results of the $(GaLu)_2O_3$-based photodetector in Example 1 of the present invention and the pure $Ga_2O_3$-based solar-blind ultraviolet photodetector in Comparative Example 1.

Further, a voltage of 10 V was applied between the electrodes of the device prepared in this example while the surface of the sample was irradiated with monochromatic light to perform photoelectric performance tests. FIGS. 5 and 7 are the time-current and wavelength-responsivity curves of the device, respectively. The results show that the device has obvious detection ability for solar-blind ultraviolet light. Compared with pure $Ga_2O_3$ solar-blind ultraviolet photodetector, it has lower dark current ($I_{dark}$<0.2 pA) and faster response speed. The device's recovery relaxation time $\tau_{d2}$ is 0.190 s, and its peak response wavelength (245 nm) and the cut-off wavelength (270 nm) are blue-shifted, showing a more sensitive detection ability for solar-blind ultraviolet light. This is due to the $(GaLu)_2O_3$ film having a wider band gap and fewer oxygen vacancy defects than pure $Ga_2O_3$. The wider band gap causes the dark current of the device to be significantly reduced, and the peak response wavelength and cut-off wavelength are blue-shifted. The reduction of oxygen vacancies in the film reduces the concentration of the trap centers, resulting in a significant reduction in the relaxation time of the device.

In summary, $(GaLu)_2O_3$-based photodetectors have lower dark current, faster response speed, and shorter cut-off wavelength than pure $Ga_2O_3$-based photodetectors, showing more sensitive and faster responding detection capability to solar-blind ultraviolet light.

Example 2

The $(GaLu)_2O_3$ ternary alloy material of this embodiment is made of $Ga_2O_3$ powder and $Lu_2O_3$ powder with a molar ratio of 95:5 by solid phase sintering. The specific method is as follows:

1.1 According to the molar ratio of $Ga_2O_3:Lu_2O_3$=95:5, weigh 8.995 g $Ga_2O_3$ powder and 1.005 g $Lu_2O_3$ powder, after mixing, add 15 g of deionized water, and then put it in a ball mill tank in a planetary ball mill (ball milling media are zirconia ceramic balls), ball mill for 4 h to obtain mixed powder;

1.2 The mixed powder obtained in step 1.1 of this embodiment is made into the $(GaLu)_2O_3$ ternary alloy material by using the same treatment process of step 1.2 and step 1.3 of the Example 1 in sequence.

The $(GaLu)_2O_3$ ternary alloy material described above in this embodiment is used to prepare a solar-blind ultraviolet photodetector. A solar-blind photodetector based on $(GaLu)_2O_3$ ternary alloy in this embodiment includes a c-plane sapphire substrate, an active layer, and a pair of parallel metal Au electrodes from bottom to top, where: The active layer is (−201) oriented $(GaLu)_2O_3$ ternary alloy film, and the (−201) oriented $(GaLu)_2O_3$ ternary alloy film is deposited using the $(GaLu)_2O_3$ ternary alloy material; The thickness of the c-plane sapphire substrate is 0.43 mm, the thickness of the active layer is 150 nm, the thickness of the parallel metal Au electrode is 55 nm, and the spacing of the parallel metal Au electrodes is 10 μm.

The solar-blind photodetector based on $(GaLu)_2O_3$ ternary alloy described above in this embodiment is prepared by the following method, including the following steps:

The solar-blind photodetector based on the $(GaLu)_2O_3$ ternary alloy of this example was prepared in the same way as in Example 1.

Figure 6:
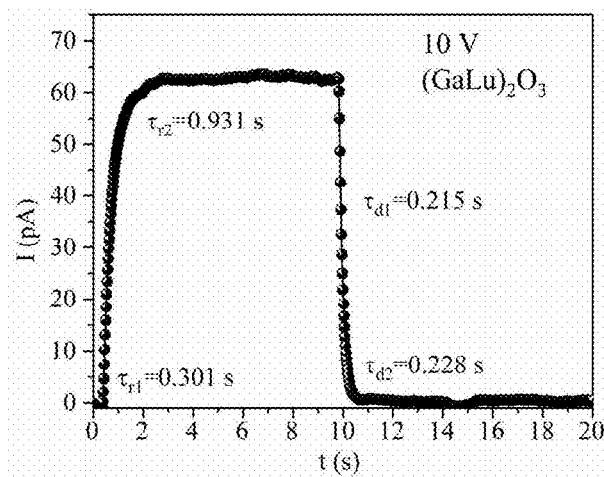
FIG. 6 is a graph of time t-current I response of a solar-blind UV photodetector based on $(GaLu)_2O_3$ ternary alloy in Example 2 of the present invention.

A voltage of 10 V was applied between the electrodes of the device prepared in this example while the surface of the sample was irradiated with monochromatic light to perform photoelectric performance tests. The results show that the dark current of the device is very low ($I_{dark}$<0.2 pA), the response speed is fast, and the device's relaxation response time $\tau_{d2}$ is 0.228 s, which shows a good detection ability for solar-blind ultraviolet light. The test results are shown in FIG. 6.

Example 3

A $(GaLu)_2O_3$ ternary alloy material in this embodiment is prepared by using the same raw material ratio and method as in Example 1.

The $(GaLu)_2O_3$ ternary alloy material described above in this embodiment is used to prepare a solar-blind ultraviolet photodetector. A solar-blind photodetector based on $(GaLu)_2O_3$ ternary alloy in this embodiment includes a c-plane sapphire substrate, an active layer, and a pair of parallel metal Au electrodes from bottom to top, where the active layer is a (−201)-oriented $(GaLu)_2O_3$ ternary alloy film, and the (−201)-oriented $(GaLu)_2O_3$ ternary alloy film is deposited using the $(GaLu)_2O_3$ ternary alloy material; The thickness of the c-plane sapphire substrate is 0.43 mm, the thickness of the active layer is 300 nm, the thickness of the parallel metal Au electrodes is 30 nm, and the spacing of the parallel metal Au electrodes is 50 μm.

The solar-blind photodetector based on $(GaLu)_2O_3$ ternary alloy described above in this embodiment is prepared by the following method, including the following steps:

2.1 Using the $(GaLu)_2O_3$ ternary alloy material prepared in this example as a laser ablation target, it was loaded into a vacuum chamber together with a sapphire substrate that was ultrasonically cleaned with acetone, absolute ethanol, and deionized water, etc. for 15 min. And the chamber was evacuated to $10^{-4}$ Pa;

2.2 After the substrate temperature is raised to 500° C., oxygen is introduced to maintain the gas pressure at 1 Pa during the entire film deposition process; then the substrate and the target are set to rotate, and the laser output energy and pulse repetition frequency are set to 500 mJ/pulse and 5 Hz, respectively, and then the laser is turned on to start depositing $(GaLu)_2O_3$ ternary alloy thin film. After 30 minutes of deposition, the oxygen and heating were turned off, and finally the sample was naturally cooled to room temperature in a vacuum and taken out;

2.3 Place the obtained $(GaLu)_2O_3$ ternary alloy film on the mask plate and install it into the vacuum chamber of the vacuum evaporation machine, then install the tungsten boat and feed it with the evaporation source—metal Au 0.10 g, close the vacuum chamber and turn on the mechanical pump, fore-stage valve, molecular pump, and pump the chamber to below $10^{-4}$ Pa. Then turn on the evaporation power, slowly increase the current until the metal Au melts, and then keep the current constant and open the baffle to start evaporation. After the metal Au is evaporated, the current is slowly reduced, the evaporation source is closed, the molecular pump, the fore-stage valve, and the mechanical pump are turned off, and then the air valve is open to flow air into the chamber. Finally the solar-blind ultraviolet photodetector based on the $(GaLu)_2O_3$ ternary alloy is obtained.

Example 4

A $(GaLu)_2O_3$ ternary alloy material in this embodiment is prepared by using the same raw material ratio and method as in Example 1.

The $(GaLu)_2O_3$ ternary alloy material described above in this embodiment is used to prepare a solar-blind ultraviolet photodetector. A solar-blind photodetector based on $(GaLu)_2O_3$ ternary alloy in this embodiment includes a c-plane sapphire substrate, an active layer, and a pair of parallel metal Au electrodes from bottom to top, where: The active layer is a (−201)-oriented $(GaLu)_2O_3$ ternary alloy film, and the (−201)-oriented $(GaLu)_2O_3$ ternary alloy film is deposited using the $(GaLu)_2O_3$ ternary alloy material; The thickness of the c-plane sapphire substrate is 0.43 mm, the thickness of the active layer is 200 nm, the thickness of the parallel metal Au electrode is 70 nm, and the spacing of the parallel metal Au electrodes is 100 μm.

The solar-blind photodetector based on $(GaLu)_2O_3$ ternary alloy in this embodiment is prepared by the following method, including the following steps:

2.1 Using the $(GaLu)_2O_3$ ternary alloy material prepared in this example as a laser ablation target, it was loaded into a vacuum chamber together with a sapphire substrate that was ultrasonically cleaned with acetone, absolute ethanol, and deionized water, etc. for 15 min. And the chamber was evacuated to $10^{-4}$ Pa;

2.2 After the substrate temperature is raised to 300° C., oxygen is introduced to maintain the gas pressure at 8 Pa throughout the film deposition process; then the substrate and the target are set to rotate, and the laser output energy and pulse repetition frequency are set to 600 mJ/pulse and 5 Hz, respectively, and then the laser is turned on to start depositing $(GaLu)_2O_3$ ternary alloy thin film. After 30 minutes of deposition, the oxygen and heating were turned off, and finally the sample was naturally cooled to room temperature in a vacuum and taken out;

2.3 Place the obtained $(GaLu)_2O_3$ ternary alloy film on the mask plate and install it into the vacuum chamber of the vacuum evaporation machine, then install the tungsten boat and feed it with the evaporation source-metal Au 0.25 g, close the vacuum chamber, and turn on the mechanical pump, fore-stage valve, molecular pump, and pump the chamber to below $10^{-4}$ Pa. Then turn on the evaporation power, slowly increase the current until the metal Au melts, and then keep the current constant and open the baffle to start evaporation. After the metal Au is evaporated, the current is slowly reduced, the evaporation source is closed, the molecular pump, the fore-stage valve, and the mechanical pump are turned off, and then the air valve is opened to flow air into the chamber. Finally the solar-blind photodetector based on the $(GaLu)_2O_3$ ternary alloy is obtained.

Example 5

A $(GaSc)_2O_3$ ternary alloy material of this embodiment is made of $Ga_2O_3$ powder and $Sc_2O_3$ powder with a molar ratio of 95:5 by solid phase sintering. The specific method is as follows:

1.1 According to the molar ratio of $Ga_2O_3:Sc_2O_3=95:5$, weigh 9.627 g $Ga_2O_3$ powder and 0.373 g $Sc_2O_3$ powder, after mixing, add 15 g of deionized water, and then put it in a ball mill tank in a planetary ball mill (the ball milling media are zirconia ceramic balls), ball mill for 4 h to obtain mixed powder;

1.2 Sieve the mixed powder to remove the zirconia balls, place it in a vacuum drying oven, vacuum dry at 110° C. for 12 h, take it out and cool to room temperature, add 1 g of deionized water, and grind it thoroughly with a mortar, and then press it using a tablet press at 8 M Pa pressure to form a wafer with a diameter of 27.5 mm and a thickness of 2 mm;

1.3 Place the wafer into a crucible in a vacuum tube furnace and place a powder (15.000 g) of the same composition around it. The tube furnace was heated to 1300° C. and kept for 3 hours, and then naturally cooled to room temperature to obtain the $(GaSc)_2O_3$ ternary alloy material.

Figure 8:
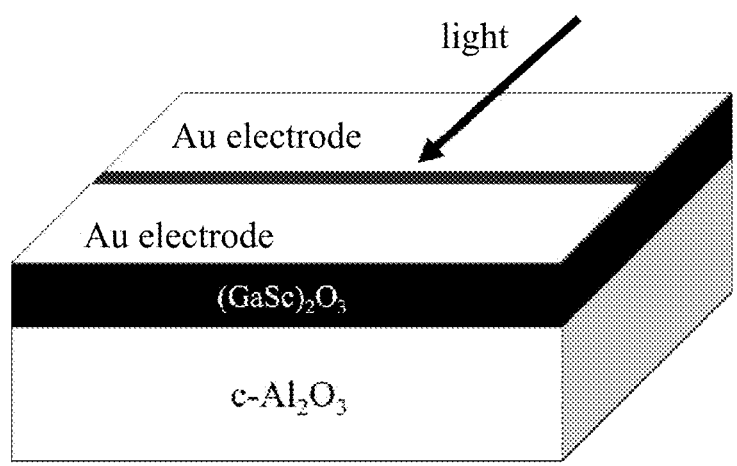
FIG. 8 is a schematic structural view of a solar-blind ultraviolet photodetector based on $(GaSc)_2O_3$ ternary alloy in Example 5 of the present invention.

The $(GaSc)_2O_3$ ternary alloy material described in this embodiment is used to prepare a solar-blind ultraviolet photodetector. As shown in FIG. 8, a solar-blind photodetector based on $(GaSc)_2O_3$ ternary alloy in this embodiment includes a c-plane sapphire substrate, an active layer, and a pair of parallel Metal Au electrodes, wherein: the active layer is (−201)-oriented $(GaSc)_2O_3$ ternary alloy film, and the (−201)-oriented $(GaSc)_2O_3$ ternary alloy film is deposited using the $(GaSc)_2O_3$ ternary alloy material; the thickness of the c-plane sapphire substrate is 0.43 mm, the thickness of the active layer is 150 nm, the thickness of the parallel metal Au electrode is 50 nm, and the spacing of the parallel metal Au electrodes is 10 μm.

The solar-blind photodetector based on $(GaSc)_2O_3$ ternary alloy in this embodiment is manufactured by the following method, and the steps are as follows:

2.1 Using the $(GaSc)_2O_3$ ternary alloy material prepared in step 1.3 as a laser ablation target, it was loaded into a vacuum chamber together with a sapphire substrate that was ultrasonically cleaned with acetone, absolute ethanol, and deionized water, etc. for 15 min, and pump the chamber down to $10^{-4}$ Pa;

2.2 After the substrate temperature is raised to 700° C., oxygen is introduced to maintain the gas pressure at 4 Pa during the entire film deposition process; then the substrate and target are set to rotate, and the laser output energy and pulse repetition frequency are set to 300 mJ/pulse and 5 Hz, respectively, and then the laser is turned on to start depositing $(GaSc)_2O_3$ ternary alloy thin film. After 30 minutes of deposition, the oxygen and heating were turned off, and finally the sample was naturally cooled to room temperature in a vacuum and taken out;

2.3 Place the obtained $(GaSc)_2O_3$ ternary alloy film on the mask plate and install it into the vacuum chamber of the vacuum evaporation machine, then install the tungsten boat and feed it with the evaporation source-metal Au 0.15 g, close the vacuum chamber and turn on the mechanical pump, fore-stage valve, molecular pump, and pump the chamber to below $10^{-4}$ Pa. Then turn on the evaporation power, slowly increase the current until the metal Au melts, and then keep the current constant and open the baffle to start evaporation. After the metal Au is evaporated, the current is slowly reduced, the evaporation source is closed, the molecular pump, the fore-stage valve, and the mechanical pump are turned off, and then the air valve is opened to flow air into the chamber. Finally the solar-blind ultraviolet photodetector based on the $(GaSc)_2O_3$ ternary alloy is obtained.

Figure 9:
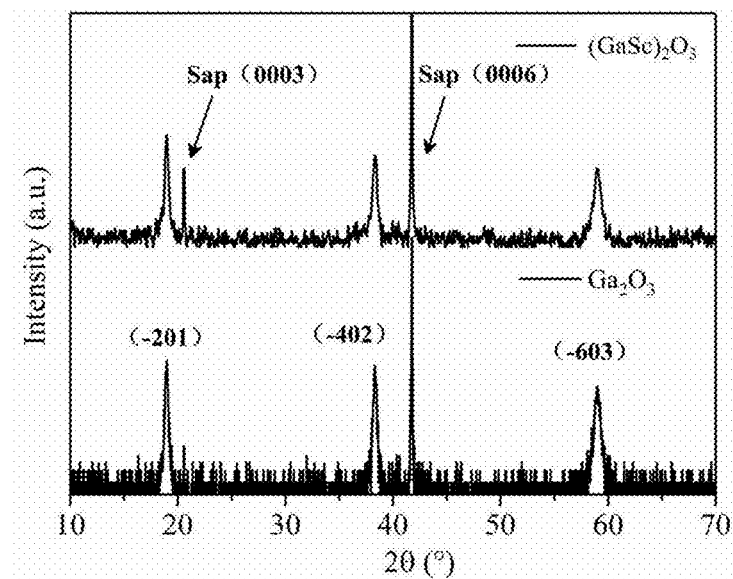
FIG. 9 is an X-ray diffraction (XRD) diagram of the $(GaSc)_2O_3$ ternary alloy thin film prepared in Example 5 of the present invention vs. the pure $Ga_2O_3$ thin film prepared in Comparative Example 1.

The XRD survey-scan spectrum of the $(GaSc)_2O_3$ ternary alloy thin film prepared in this example is shown in FIG. 9. It can be seen that in addition to the diffraction peaks of the c-plane sapphire substrate, there are only three diffraction peaks, which are located near 18.9°, 38.3°, and 59.1°, respectively. Comparing with the standard XRD spectrum of $Ga_2O_3$ (JCPDS File No. 41-1103), it can be seen that these three diffraction peaks correspond to the (−201), (−402) and (−603) crystal planes of $Ga_2O_3$, respectively, indicating that the (−201) oriented $(GaSc)_2O_3$ ternary alloy film was successfully prepared in this example.

Figure 10:
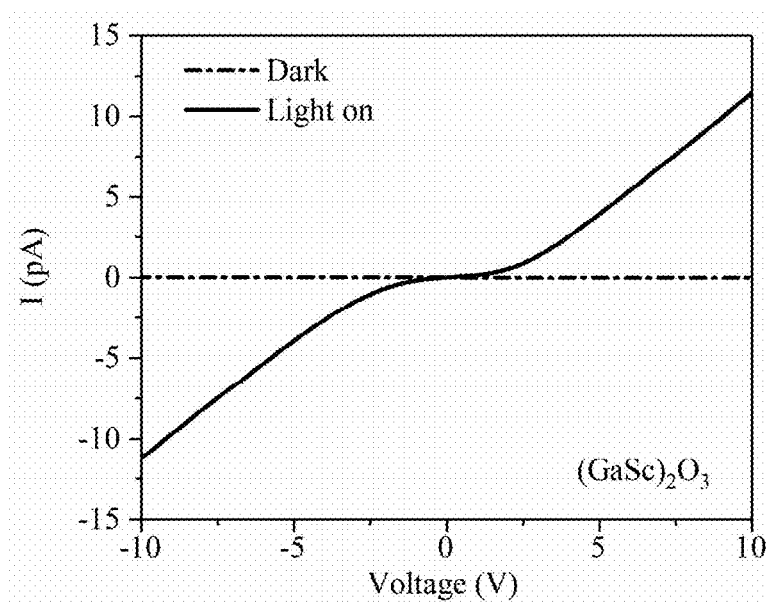
FIG. 10 is an I-V curve of a solar-blind UV photodetector based on $(GaSc)_2O_3$ ternary alloy in Example 5 of the present invention.
Figure 11:
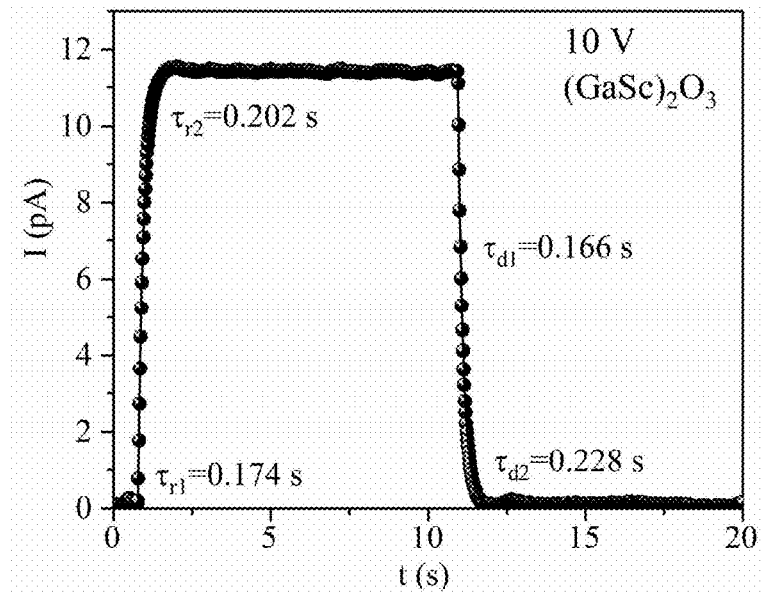
FIG. 11 is a graph of time t-current I response of a solar-blind UV photodetector based on $(GaSc)_2O_3$ ternary alloy in Example 5 of the present invention.
Figure 25:
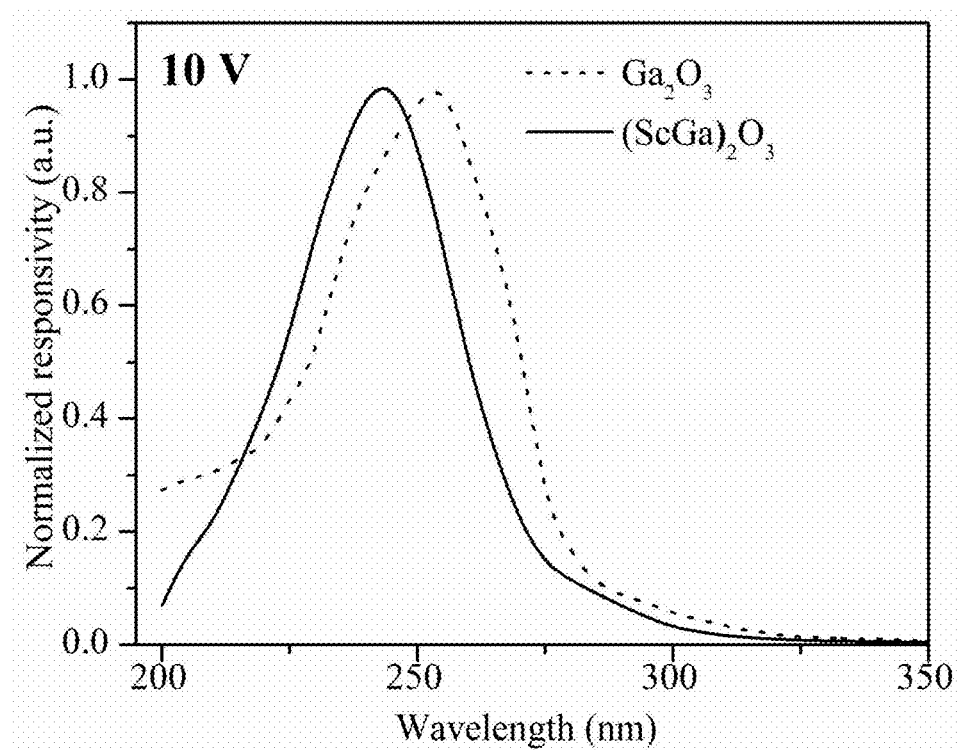
FIG. 25 is a comparison of the spectral responsivity of solar-blind UV photodetectors based on (GaSc)₂O₃ solar-blind in Example 5 of the present invention and pure Ga₂O₃ in Comparative Example 1.

FIG. 10 shows the I-V curve of a solar-blind UV photodetector based on the $(GaSc)_2O_3$ ternary alloy produced in this example. It can be clearly seen that the I-V curve under illumination is non-linear, indicating that Au and $(GaSc)_2O_3$ films form a Schottky contact. FIG. 11 shows the time-current response curve of the device at 10V bias voltage. It can be seen from FIG. 11 that under a 10 V bias voltage, the dark current of this device is very small (<0.2 pA), which is much smaller than the dark current of a pure $Ga_2O_3$-based photodetector (~10.6 pA). This is because that the band gap of $Sc_2O_3$ (5.9 eV) is larger than that of $Ga_2O_3$ (4.9 eV), and the doping of $Sc^{3+}$ ions can significantly increase the band gap of $Ga_2O_3$, thus making the dark current of photodetectors based on $(GaSc)_2O_3$ with wider band gaps significantly reduced. At the same time, we use the double exponential relaxation equation to fit the curve, and the device relaxation response times $\tau_{r2}$ and $\tau_{d2}$ are 0.202 s and 0.228 s, respectively, which are significantly shorter than the relaxation response times of the pure $Ga_2O_3$-based 0 based photodetector ($\tau_{r2}$=0.579 s $\tau_{d2}$=0.661 s). This is because that the binding energy between $Sc^{3+}$ ions and $O^{2-}$ ions is stronger than that between $Ga^{3+}$ ions and $O^{2-}$ ions, so that the $(GaSc)_2O_3$ ternary alloy film has a lower oxygen vacancy concentration than the pure $Ga_2O_3$ film. The lower concentration of oxygen vacancies leads to fewer trap centers in the film, which results in a significantly faster response speed of the device. FIG. 25 is the wavelength-responsivity curve of $(GaSc)_2O_3$ and pure $Ga_2O_3$ based photodetectors. Benefiting from the relatively wider band gap of $(GaSc)_2O_3$, the peak response wavelength (245 nm) and cutoff wavelength of $(GaSc)_2O_3$ based photodetectors (274 nm) are obviously blue shifted compared with the pure $Ga_2O_3$-based photodetector, which shows that it is more sensitive to the solar-blind ultraviolet light. In summary, $(GaSc)_2O_3$-based photodetectors have lower dark current, faster response speed and shorter cut-off wavelength compared to pure $Ga_2O_3$-based photodetectors, showing more sensitive and faster detection capability to solar-blind ultraviolet light.

Example 6

The $(GaSc)_2O_3$ ternary alloy material of this embodiment is made of $Ga_2O_3$ powder and $Sc_2O_3$ powder with a molar ratio of 70:30 by solid phase sintering. The specific method is as follows:

1.1 According to the molar ratio of $Ga_2O_3$:$Sc_2O_3$=70:30, weigh 7.603 g $Ga_2O_3$ powder and 2.397 g $Sc_2O_3$ powder, after mixing, add 15 g of deionized water, and then put it into a ball mill tank in a planetary ball mill (the ball milling medium is zirconia ceramic balls), ball mill for 4 h to obtain mixed powder;

1.2 Using the same treatment process of step 1.2 and step 1.3 of Example 5 in turn, the mixed powder obtained in step 1.1 of this example is made into the $(GaSc)_2O_3$ ternary alloy material.

The $(GaSc)_2O_3$ ternary alloy material described in this embodiment is used to prepare a solar-blind photodetector. A solar-blind photodetector based on $(GaSc)_2O_3$ ternary alloy in this embodiment includes a c-plane sapphire substrate, an active layer, and a pair of parallel metal Au electrodes from bottom to top, wherein: The active layer is a (−201)-oriented $(GaSc)_2O_3$ ternary alloy film, and the (−201)-oriented $(GaSc)_2O_3$ ternary alloy film is deposited using the $(GaSc)_2O_3$ ternary alloy material; The thickness of the c-plane sapphire substrate is 0.43 mm, the thickness of the active layer is 150 nm, the thickness of the parallel metal Au electrode is 55 nm, and the spacing of the parallel metal Au electrodes is 10 μm.

The solar-blind photodetector based on the $(GaSc)_2O_3$ ternary alloy described above in this embodiment is prepared by the same method as in Example 5.

Figure 12:
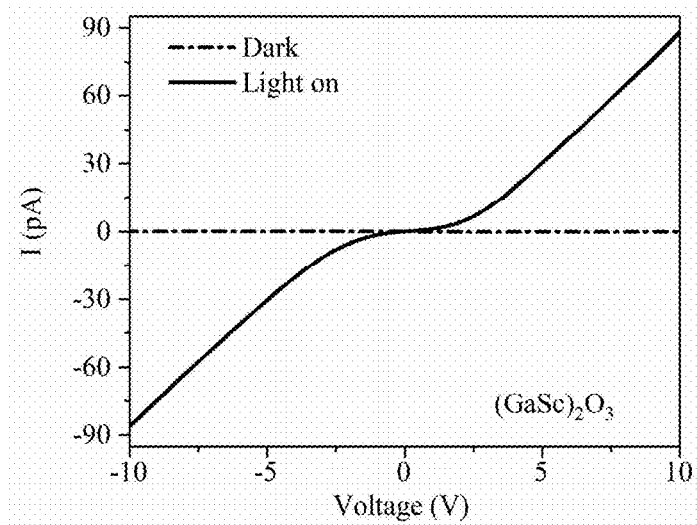
FIG. 12 is an I-V curve of a solar-blind UV photodetector based on $(GaSc)_2O_3$ ternary alloy in Example 6 of the present invention.
Figure 13:
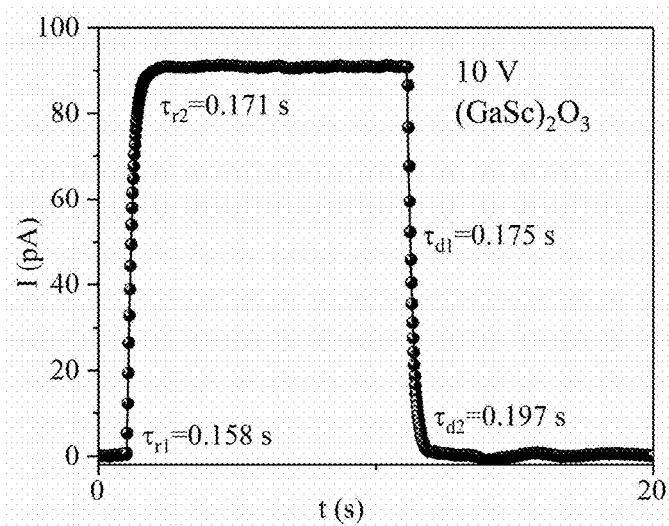
FIG. 13 is a graph of time t-current I response of a solar-blind UV photodetector based on $(GaSc)_2O_3$ ternary alloy in Example 6 of the present invention.

A voltage of 10 V was applied between the electrodes of the device prepared in this example while the surface of the sample was irradiated with monochromatic light to perform photoelectric performance tests. The results show that the dark current of the device is very low ($I_{dark}$<0.2 pA), and the response speed is relatively fast. The relaxation response times $\tau_{r2}$ and $\tau_{d2}$ of the device are 0.171 s and 0.197 s, respectively, showing good detection ability for solar-blind UV light. The test results are shown in FIG. 12 and FIG. 13, respectively.

Example 7

A $(GaSc)_2O_3$ ternary alloy material of this embodiment is made of $Ga_2O_3$ powder and $Sc_2O_3$ powder with a molar ratio of 70:30 by solid phase sintering. The specific method is the same as that of Example 6.

The $(GaSc)_2O_3$ ternary alloy material described in this embodiment is used to prepare a solar-blind ultraviolet photodetector. A solar-blind ultraviolet photodetector based on $(GaSc)_2O_3$ ternary alloy in this embodiment includes a c-plane sapphire substrate, an active layer, and a pair of parallel metal Al electrodes from bottom to top, wherein: The active layer is a (−201)-oriented $(GaSc)_2O_3$ ternary alloy film, and the (−201)-oriented $(GaSc)_2O_3$ ternary alloy film is deposited using the $(GaSc)_2O_3$ ternary alloy material; The thickness of the c-plane sapphire substrate is 0.43 mm, the thickness of the active layer is 300 nm, the thickness of the parallel metal Al electrode is 30 nm, and the spacing of the parallel metal Al electrodes is 50 μm.

The preparation method of the $(GaSc)_2O_3$ ternary alloy-based solar-blind ultraviolet photodetector described in this embodiment is basically the same as the preparation method of the (GaLu)$_2$O$_3$ ternary alloy-based solar-blind ultraviolet photodetector of Example 3. The only difference is that the laser ablation target uses (GaSc)$_2$O$_3$ ternary alloy material made in this embodiment, and the evaporation source in this embodiment is metal Al, and the amount is 0.10 g.

Example 8

A (GaSc)$_2$O$_3$ ternary alloy material of this embodiment is made of Ga$_2$O$_3$ powder and Sc$_2$O$_3$ powder with a molar ratio of 70:30 by solid phase sintering. The specific method is the same as that of Example 6.

The (GaSc)$_2$O$_3$ ternary alloy material described in this embodiment is used to prepare a solar-blind ultraviolet photodetector. A solar-blind photodetector based on (GaSc)$_2$O$_3$ ternary alloy in this embodiment includes a c-plane sapphire substrate, an active layer, and a pair of parallel metal Pt electrodes from bottom to top, wherein: The active layer is a (−201)-oriented (GaSc)$_2$O$_3$ ternary alloy thin film, the thickness of the c-plane sapphire substrate is 0.43 mm, the thickness of the active layer is 200 nm, the thickness of the parallel metal Pt electrode is 70 nm, and the spacing of the parallel metal Pt electrodes is 100 μm.

The preparation method of the solar-blind ultraviolet photodetector based on (GaSc)$_2$O$_3$ ternary alloy in this embodiment is basically the same as the preparation method of the solar-blind ultraviolet photodetector based on (GaLu)$_2$O$_3$ ternary alloy in Example 4. Only difference is that in this embodiment, the laser ablation target uses (GaSc)$_2$O$_3$ ternary alloy material made in this embodiment, and the evaporation source in this embodiment is metal Pt, and the amount is 0.25 g.

Example 9

The (GaY)$_2$O$_3$ ternary alloy material of this embodiment is made of Ga$_2$O$_3$ powder and Y$_2$O$_3$ powder with a molar ratio of 70:30 by solid phase sintering. The specific method is as follows:

1.1 According to the molar ratio Ga$_2$O$_3$:Y$_2$O$_3$=70:30, weigh 6.595 g of Ga$_2$O$_3$ powder and 3.401 g of Y$_2$O$_3$ powder, after mixing, add 15 g of deionized water, and then place in a ball mill tank in a planetary ball mill, wherein the ball milling medium is zirconia Ceramic balls, ball mill for 4 h to obtain mixed powder.

1.2 Sieve the mixed powder to remove the zirconia balls, place it in a vacuum drying oven, vacuum dry at 110° C. for 12 h, take out and cool to a room temperature, add 1 g of deionized water, and grind thoroughly with a mortar, and then press with a tablet press at 8 M Pa pressure to form a wafer with a diameter of 27.5 mm and a thickness of 2 mm;

1.3 Place the wafer into a crucible in a vacuum tube furnace and place a powder (15.000 g) of an identical composition around the wafer. Heat the tube furnace to 1300° C. and hold for 3 hours, and then naturally cool to room temperature to obtain the (GaY)$_2$O$_3$ ternary alloy material.

Figure 14:
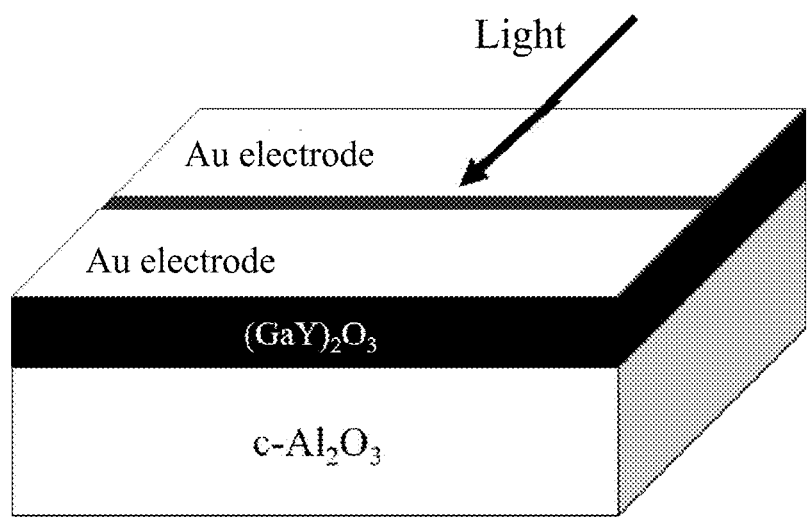
FIG. 14 is a schematic structural view of a solar-blind photodetector based on $(GaY)_2O_3$ ternary alloy in Example 9 of the present invention.

The (GaY)$_2$O$_3$ ternary alloy material described in this embodiment is used to prepare a solar-blind ultraviolet photodetector. As shown in FIG. 14, a solar-blind photodetector based on (GaY)$_2$O$_3$ ternary alloy in this embodiment includes a c-plane sapphire substrate, an active layer, and a pair of parallel Metal Au electrodes, wherein: the active layer is an amorphous (GaY)$_2$O$_3$ ternary alloy thin film, and the amorphous (GaY)$_2$O$_3$ ternary alloy thin film is deposited using the (GaY)$_2$O$_3$ ternary alloy material; The thickness of the c-plane sapphire substrate is 0.43 mm, the thickness of the active layer is 150 nm, the thickness of the parallel metal Au electrode is 50 nm, and the spacing of the parallel metal Au electrodes is 10 μm.

The preparation method of the high-gain solar-blind ultraviolet photodetector based on the (GaY)$_2$O$_3$ ternary alloy in this embodiment is basically the same as the preparation method of the solar-blind ultraviolet photodetector based on the (GaLu)$_2$O$_3$ ternary alloy in Example 1. The only difference is that, the laser ablation target uses (GaY)$_2$O$_3$ ternary alloy material made in this embodiment.

Figure 15:
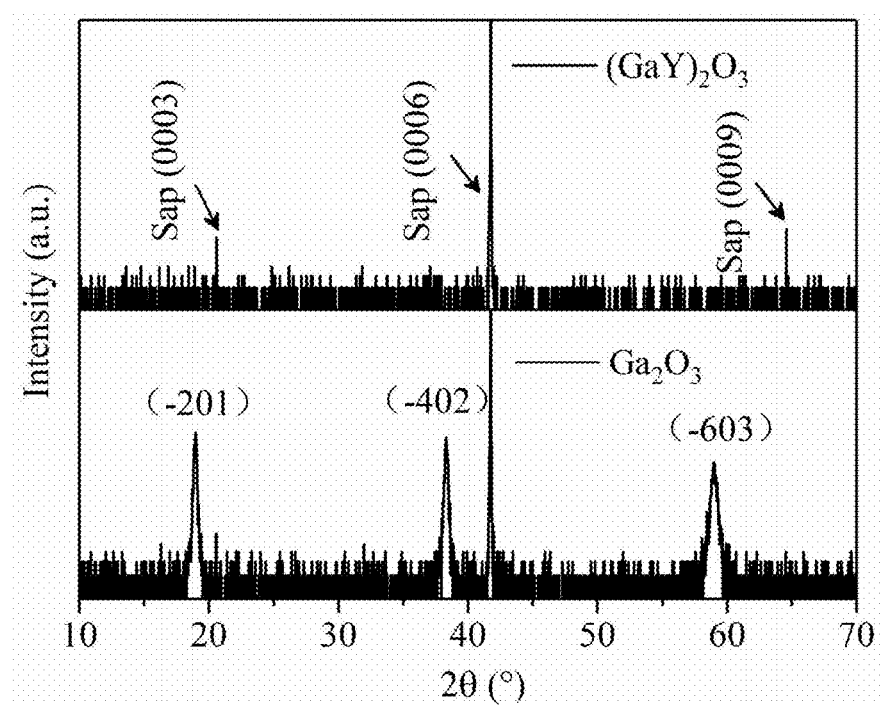
FIG. 15 is an X-ray diffraction (XRD) full spectrum chart of the amorphous (GaY)₂O₃ film in Example 9 of the present invention vs. pure Ga₂O₃ thin film prepared in Comparative Example 1.
Figure 16:
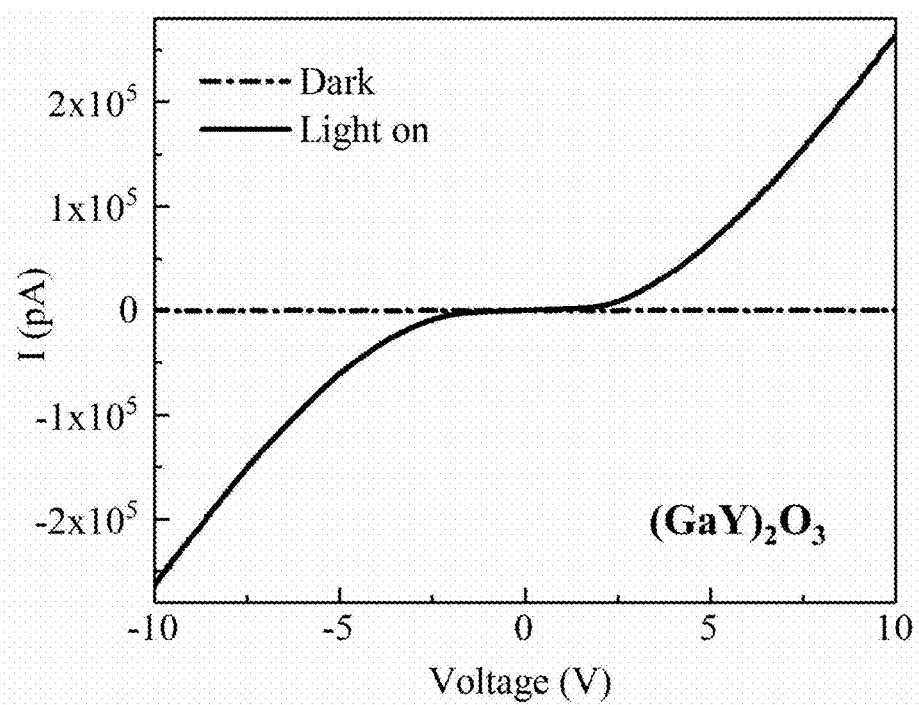
FIG. 16 is an I-V curve of a solar-blind ultraviolet photodetector based on (GaY)₂O₃ ternary alloy in Example 9 of the present invention.
Figure 17:
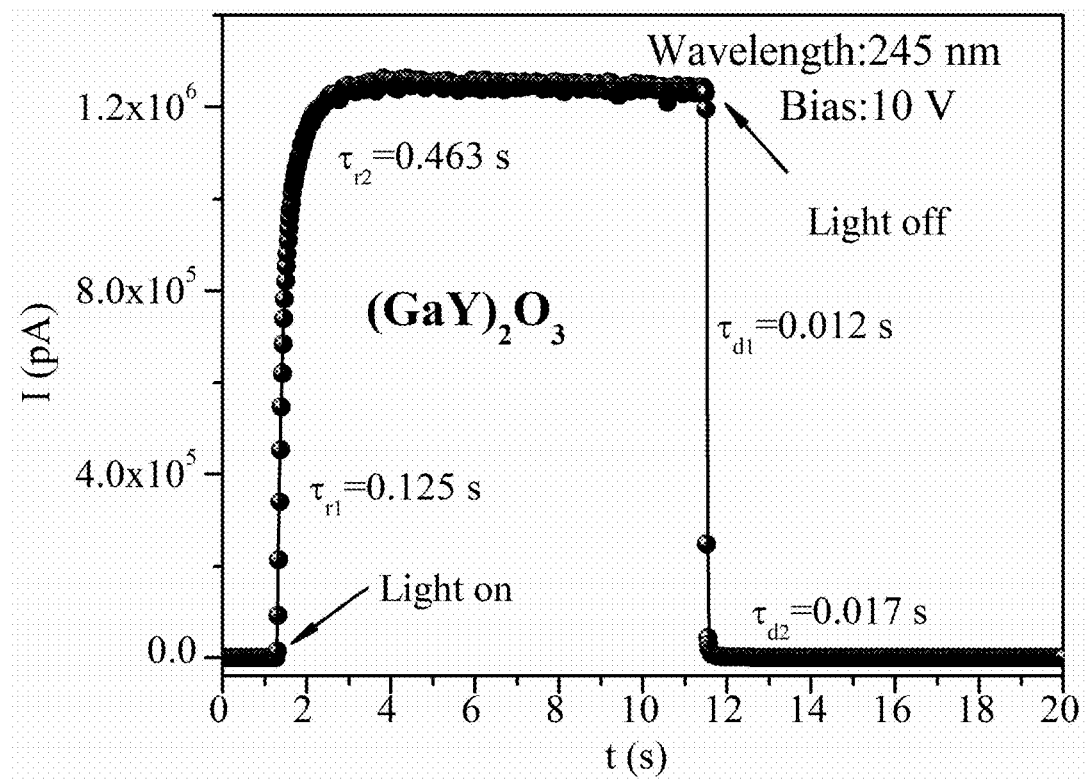
FIG. 17 is a graph of time t-current I response of a solar-blind UV photodetector based on (GaY)₂O₃ ternary alloy in Example 9 of the present invention.
Figure 26:
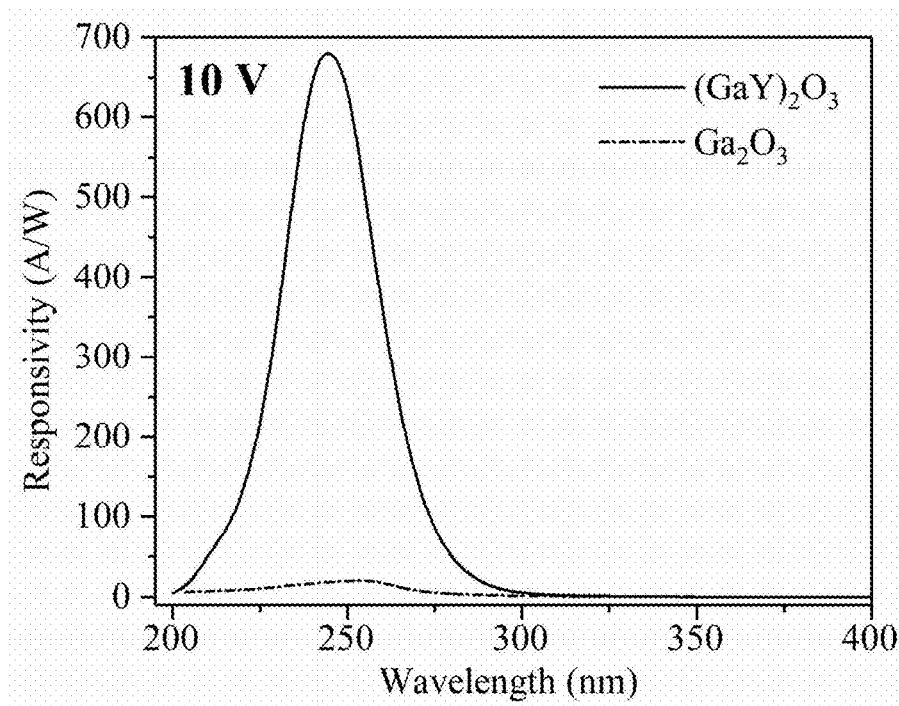
FIG. 26 is a comparison of the spectral responsivity of solar blind ultraviolet photodetectors based on (GaY)₂O₃ in Example 9 of the present invention and pure Ga₂O₃ in Comparative Example 1.

FIG. 15 is the XRD survey-scan spectrum of (GaY)$_2$O$_3$ thin film and pure Ga$_2$O$_3$ thin film. As shown in the figure, for the (GaY)$_2$O$_3$ thin film, except for the diffraction peaks of the c-plane sapphire substrate, no other diffraction peaks were found, indicating that this embodiment successfully obtained an amorphous (GaY)$_2$O$_3$ ternary alloy thin film. FIG. 16 is the I-V curve of the (GaY)$_2$O$_3$ solar-blind ultraviolet photodetector produced in this example. It can be clearly seen that the I-V curve under illumination is non-linear, indicating that there is a formation of Schottky contact between Au and (GaY)$_2$O$_3$ film. FIG. 17 is the time-current response curve of the device at 10V bias voltage. It can be seen from the figure that the dark current of this device is very small (~0.1 pA) at 10 V bias, which is much smaller than the dark current of pure Ga$_2$O$_3$-based photodetectors (~10.6 pA). This is because that the band gap of Y$_2$O$_3$ (5.6 eV) is larger than that of Ga$_2$O$_3$ (4.9 eV), and the doping of Y$^{3+}$ ions can significantly increase the band gap of Ga$_2$O$_3$, which makes the dark current of photodetectors based on (GaY)$_2$O$_3$ with wider band gaps significantly reduced. At the same time, we use the double exponential relaxation equation to fit the curve, and the device relaxation response time $\tau_{d2}$ is only 0.017 s, which is much shorter than the relaxation response time of the pure Ga$_2$O$_3$-based photodetector ($\tau_{d2}$=0.661 s). This is because that the binding energy between Y$^{3+}$ ions and O$^{2-}$ ions is stronger than that between Ga$^{3+}$ ions and O$^{2-}$ ions, so that the (GaY)$_2$O$_3$ ternary alloy film has a lower oxygen vacancy concentration than the pure Ga$_2$O$_3$ film. The lower concentration of oxygen vacancies leads to fewer trap centers in the film, which results in a significantly faster relaxation response speed of the device. At the same time, unlike pure Ga$_2$O$_3$ thin films, there are many dangling bonds and surface state defects in amorphous (GaY)$_2$O$_3$ films. These defects can be used as carrier recombination centers to promote carrier recombination, so they can greatly reduce the relaxation response time of the photodetector. FIG. 26 is the wavelength-responsivity curve of the (GaY)$_2$O$_3$ based photodetector and the comparative example 1 pure Ga$_2$O$_3$ based photodetector of this embodiment. Benefiting from the relatively wider band gap of (GaY)$_2$O$_3$, the peak response wavelength of (GaY)$_2$O$_3$ based photodetector (245 nm), is shorter than that of the pure Ga$_2$O$_3$ based photodetector (255 nm). In addition, the (GaY)$_2$O$_3$-based photodetector prepared in this example has a peak responsivity ($R_{max}$=691.3 A/W), a detection rate (D*=1.37×10$^{16}$), and a light-dark current ratio ($I_{light}/I_{dark}$=1.1×10$^7$), much higher than the peak responsivity ($R_{max}$=20.9 A/W), detection rate (D*=8.04×10$^{13}$), and light-dark current ratio ($I_{light}/I_{dark}$=6.9×10$^3$) of pure Ga$_2$O$_3$-based photodetectors.

In summary, (GaY)$_2$O$_3$-based photodetectors have lower dark current, significantly faster recovery speed, shorter peak response wavelength, and significantly increased peak responsivity and detection rate than pure Ga$_2$O$_3$-based photodetectors, showing a more sensitive and faster detection capability for solar-blind ultraviolet light.

Example 10

A $(GaY)_2O_3$ ternary alloy material in this embodiment is made of $Ga_2O_3$ powder and $Y_2O_3$ powder with a molar ratio of 95:5 by solid phase sintering. The specific method is as follows:

1.1 According to the molar ratio of $Ga_2O_3:Y_2O_3=95:5$, weigh 9.403 g $Ga_2O_3$ powder and 0.596 g $Y_2O_3$ powder, after mixing, add 15 g of deionized water, and then put it in a ball mill tank of the planetary ball mill (ball milling media are zirconia ceramic balls), ball mill for 4 h to obtain mixed powder;

1.2 The obtained mixed powder is made into the $(GaY)_2O_3$ ternary alloy material by using the same processing steps of step 1.2 and step 1.3 of Example 1 in sequence.

The $(GaY)_2O_3$ ternary alloy material described in this embodiment is used to prepare a solar-blind ultraviolet photodetector. A solar-blind photodetector based on $(GaY)_2O_3$ ternary alloy in this embodiment includes a c-plane sapphire substrate, an active layer, and a pair of parallel metal Au electrodes from bottom to top, where: The active layer is an amorphous $(GaY)_2O_3$ thin film, the amorphous $(GaY)_2O_3$ thin film is deposited using the $(GaY)_2O_3$ ternary alloy material; the thickness of the c-plane sapphire substrate is 0.43 mm, and the thickness of the active layer is 150 nm, the thickness of the parallel metal Au electrode is 55 nm, and the spacing of the parallel metal Au electrodes is 10 μm.

The solar-blind ultraviolet photodetector based on $(GaY)_2O_3$ ternary alloy described in this embodiment is prepared by the same preparation method as the solar-blind ultraviolet photodetector based on $(GaY)_2O_3$ ternary alloy in Example 9.

Figure 18:
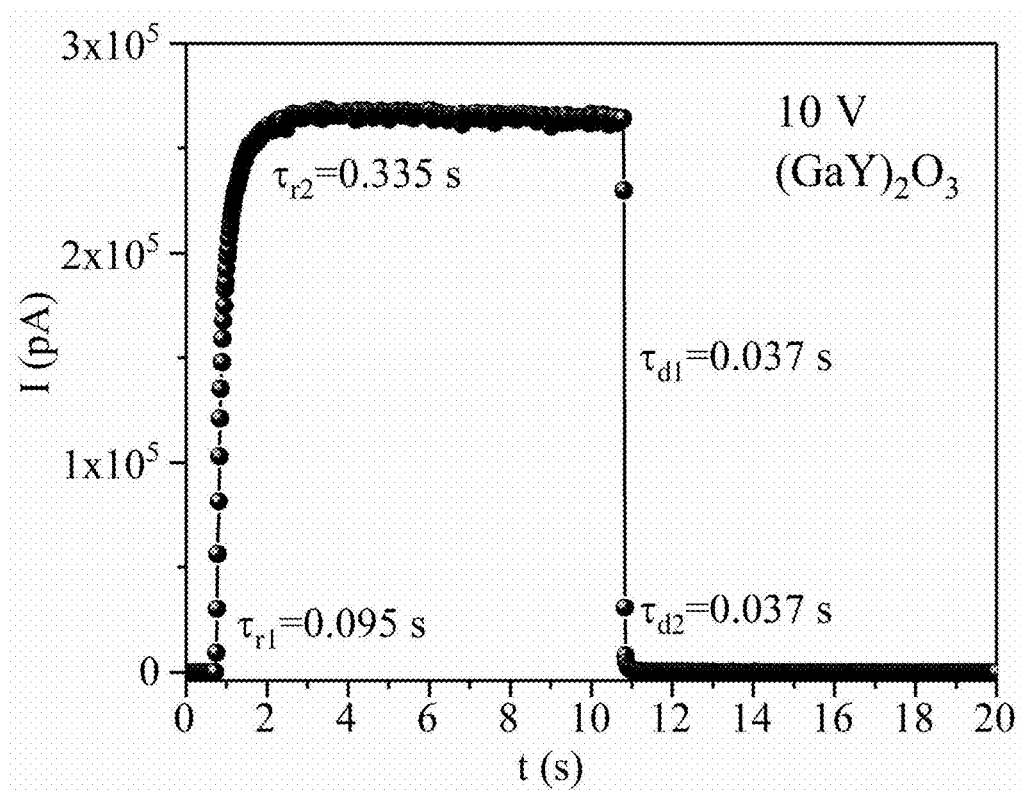
FIG. 18 is a graph of time t-current I response of a solar-blind UV photodetector based on (GaY)₂O₃ ternary alloy in Example 10 of the present invention.

A voltage of 10 V was applied between the electrodes of the device prepared in this example while the surface of the sample was irradiated with monochromatic light to perform photoelectric performance tests. The results show that the dark current of the device is very low ($I_{dark}$=1.5 pA), the response speed is faster, and the device's recovery response time $\tau_{d2}$ is only 0.037 s, which shows a good detection ability for solar-blind ultraviolet light. The test results are shown in FIG. 18.

Example 11

A $(GaY)_2O_3$ ternary alloy material in this embodiment is made of $Ga_2O_3$ powder and $Y_2O_3$ powder with a molar ratio of 70:30 by solid phase sintering. The specific method is the same as that of Example 9.

The $(GaY)_2O_3$ ternary alloy material described in this embodiment is used to prepare a solar-blind ultraviolet photodetector. A solar-blind photodetector based on $(GaY)_2O_3$ ternary alloy in this embodiment includes a c-plane sapphire substrate, an active layer, and a pair of parallel metal Al electrodes from bottom to top, where: The active layer is an amorphous $(GaY)_2O_3$ ternary alloy film, and the amorphous $(GaY)_2O_3$ ternary alloy film is deposited using the $(GaY)_2O_3$ ternary alloy material; the thickness of the c-plane sapphire substrate is 0.43 mm, the thickness of the active layer is 300 nm, the thickness of the parallel metal Al electrode is 30 nm, and the spacing of the parallel metal Al electrodes is 50 μm.

The solar-blind photodetector based on $(GaY)_2O_3$ ternary alloy in this embodiment is prepared by the same preparation method as the solar-blind ultraviolet photodetector based on $(GaLu)_2O_3$ ternary alloy in Example 3, with the only difference: in this embodiment the laser ablation target material used is $(GaY)_2O_3$ ternary alloy material made in this embodiment, and the evaporation source in this embodiment is metal Al, and the amount is 0.10 g.

Example 12

A $(GaY)_2O_3$ ternary alloy material in this embodiment is made of $Ga_2O_3$ powder and $Y_2O_3$ powder with a molar ratio of 70:30 by solid phase sintering. The specific method is the same as that of Example 9.

The $(GaY)_2O_3$ ternary alloy material described in this embodiment is used to prepare a solar-blind ultraviolet photodetector. A solar-blind photodetector based on $(GaY)_2O_3$ ternary alloy in this embodiment includes a c-plane sapphire substrate, an active layer, and a pair of parallel metal Pt electrodes from bottom to top, where: The active layer is an amorphous $(GaY)_2O_3$ ternary alloy film, the amorphous $(GaY)_2O_3$ ternary alloy film is deposited using the $(GaY)_2O_3$ ternary alloy material; the thickness of the c-plane sapphire substrate is 0.43 mm, the thickness of the active layer is 200 nm, the thickness of the parallel metal Pt electrode is 70 nm, and the spacing of the parallel metal Pt electrodes is 100 μm.

The preparation method of the solar-blind ultraviolet photodetector based on $(GaY)_2O_3$ ternary alloy in this embodiment is basically the same as the preparation method of the solar-blind ultraviolet photodetector based on $(GaLu)_2O_3$ ternary alloy in Example 4, with the only difference: in this embodiment the laser ablation target material used is $(GaY)_2O_3$ ternary alloy material made in this embodiment, and the evaporation source in this embodiment is Pt, and the amount is 0.25 g.

Example 13

A $(GaLu)_2O_3$ ternary alloy material of this embodiment is made of $Ga_2O_3$ powder and $Lu_2O_3$ powder with a molar ratio of 95:5 by solid phase sintering. The specific method is as follows:

1.1 According to the molar ratio of $Ga_2O_3:Lu_2O_3=95:5$, weigh 8.995 g $Ga_2O_3$ powder and 1.005 g $Lu_2O_3$ powder, after mixing, add 15 g of deionized water, and then put it in a ball mill tank in a planetary ball mill (the ball milling media are zirconia ceramic balls), ball milling for 4 hours to obtain mixed powder;

1.2 Place the mixed powder in a vacuum drying oven, vacuum dry at 110° C. for 12 h, take it out and cool it to room temperature naturally, sieve out the zirconia balls, add 1 g of deionized water, use a grinding bowl to grind it evenly, and then press it using a tablet press into a wafer with a diameter of 27.5 mm and a thickness of 2 mm at a pressure of 8 MPa;

1.3 Place the wafer into a crucible in a vacuum tube furnace, and put a powder (15.0000 g) of the same composition around it. The tube furnace was heated to 1300° C. and kept for 3 hours, and then naturally cooled to room temperature to obtain the $(GaLu)_2O_3$ ternary alloy material.

The $(GaLu)_2O_3$ ternary alloy material described above in this embodiment is used to prepare a solar-blind ultraviolet photodetector. A solar-blind ultraviolet photodetector based on $(GaLu)_2O_3$ ternary alloy in this embodiment includes an m-plane sapphire substrate, an active layer, and a pair of parallel metal electrodes in sequence from bottom to top, where: The active layer is an amorphous $(GaLu)_2O_3$ ternary alloy film, the amorphous $(GaLu)_2O_3$ ternary alloy film is deposited using the $(GaLu)_2O_3$ ternary alloy material; the parallel metal electrode material is Au, the thickness of the substrate is 0.43 mm, the thickness of the active layer is 120 nm, the thickness of the parallel metal Au electrode is 50 nm, and the spacing of the parallel metal Au electrodes is 10 μm.

The solar-blind photodetector based on $(GaLu)_2O_3$ ternary alloy in this embodiment is prepared by the following method, including the following steps:

2.1 Use the $(GaLu)_2O_3$ ternary alloy material prepared in step 1.3 as a laser ablation target, and put it into a vacuum chamber together with an m-plane sapphire substrate that has been ultrasonically cleaned with acetone, absolute ethanol, and deionized water for 15 minutes sequentially. And the chamber is evacuated to $10^{-4}$ Pa;

2.2 After the substrate temperature reaches 700° C., oxygen is introduced to maintain the gas pressure at 6 Pa during the entire film deposition process; then the substrate and the target are set to rotate, the laser output energy and pulse repetition frequency are set to 300 mJ/pulse and 5 Hz, respectively, and then turn on the laser and start depositing $(GaLu)_2O_3$ ternary alloy thin film. After 30 minutes of deposition, the oxygen and heating were turned off, and finally the sample was naturally cooled to room temperature in a vacuum and taken out;

2.3 Place the obtained $(GaLu)_2O_3$ ternary alloy film on the mask plate and install it in the vacuum chamber of the vacuum evaporation machine, then install the tungsten boat and feed it with the evaporation source-metal Au 0.2 g, close the vacuum chamber and turn on the mechanical pump, fore-stage valve, molecular pump, and pump the chamber to below $10^{-4}$ Pa. Then turn on the evaporation power, slowly increase the current until the metal Au melts, and then keep the current constant and open the baffle to start evaporation. After the metal Au is evaporated, the current is slowly reduced, the evaporation source is closed, the molecular pump, the fore-stage valve, and the mechanical pump are turned off, and then the air valve is opened to flow air into the chamber. Finally the solar-blind photodetector based on the amorphous $(GaLu)_2O_3$ film is obtained.

Figure 19:
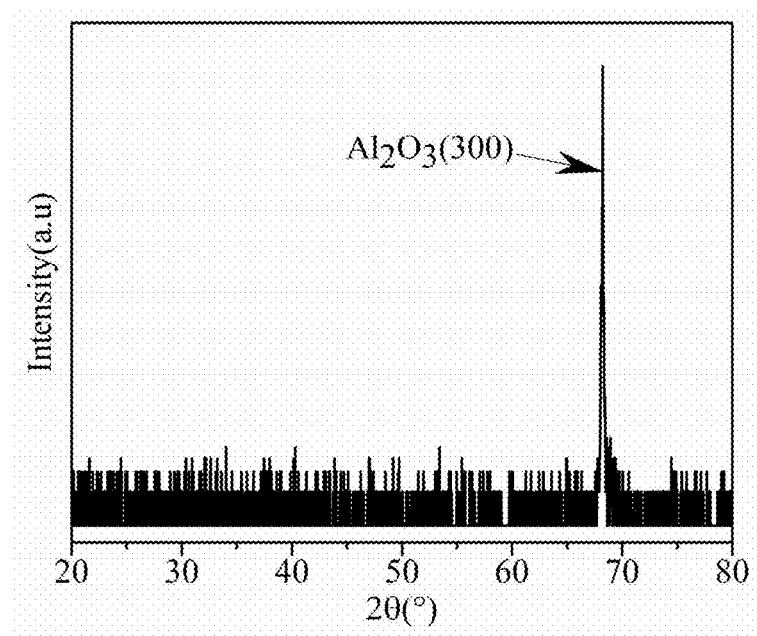
FIG. 19 is an XRD full spectrum of the amorphous (GaLu)₂O₃ thin film prepared in Example 13 of the present invention.
Figure 20:
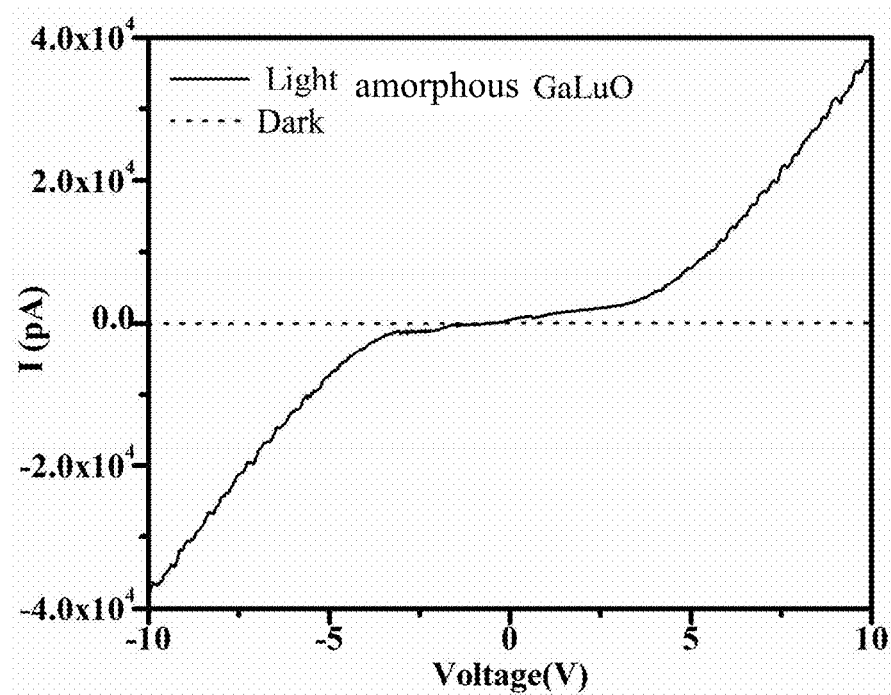
FIG. 20 is an I-V curve of a solar-blind UV photodetector based on (GaLu)₂O₃ ternary alloy in Example 13 of the present invention.
Figure 21:
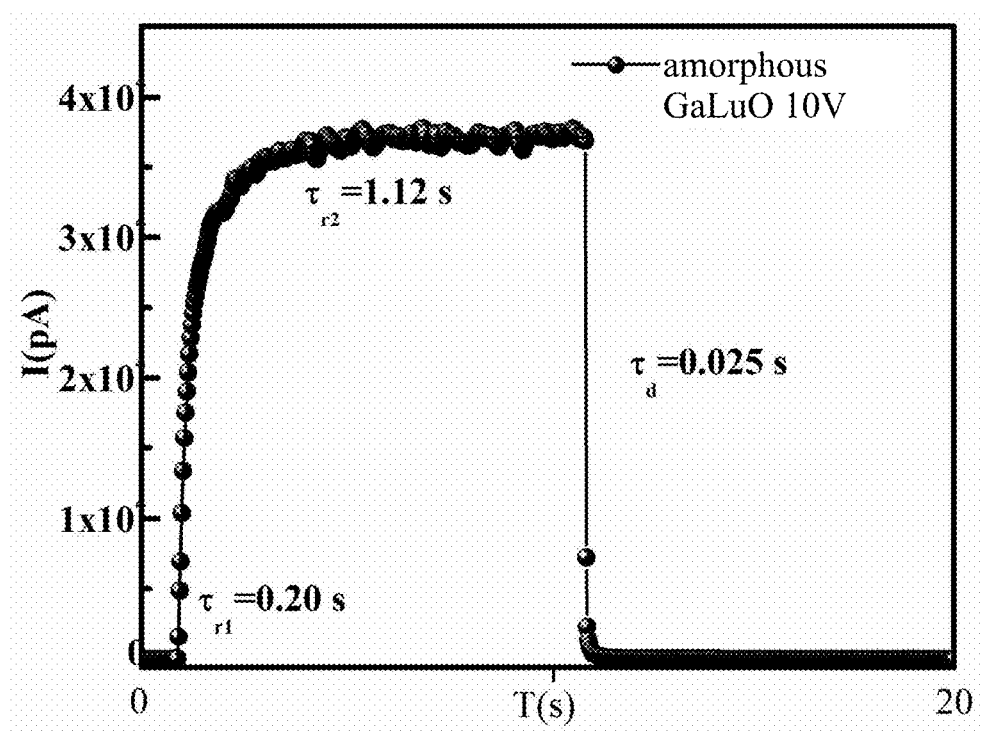
FIG. 21 is a graph of time t-current I response of a solar-blind UV photodetector based on (GaLu)₂O₃ ternary alloy in Example 13 of the present invention.

FIG. 19 is an XRD survey-scan spectrum of an amorphous $(GaLu)_2O_3$ ternary alloy thin film prepared in this example. As shown in the figure, except for the diffraction peak of the m-plane sapphire substrate, there are no other diffraction peaks, indicating that in this embodiment an amorphous $(GaLu)_2O_3$ thin film was successfully obtained. FIG. 20 is the I-V curve of a solar-blind UV photodetector based on $(GaLu)_2O_3$ ternary alloy produced in this example, it can be clearly seen that the I-V curve under illumination is nonlinear, indicating that the Schottky contact is formed between the Au and amorphous $(GaLu)_2O_3$ ternary alloy film. FIG. 21 shows the time-current response curve of the device at 10 V bias voltage. It can be seen from FIG. 21 that under a 10V bias voltage, the dark current of the device is extremely low ($I_{dark}$=0.4 pA). This is because $Lu_2O_3$ and $Ga_2O_3$ form a $(GaLu)_2O_3$ alloy, that is, the incorporation of $Lu^{3+}$ widens the band gap of $Ga_2O_3$, so that the dark current of $(GaLu)_2O_3$-based photodetectors with a wider band gap is significantly reduced. At the same time, we use the double exponential relaxation equation $I=I_0+Ae^{-t/\tau_1}+Be^{-t/\tau_2}$ to fit the curve, and the device recovery response time $\tau_{d2}$ is only 0.020 s, which is much shorter than the recovery response time of the pure $Ga_2O_3$-based photodetector ($\tau_{d2}$=0.661 s). This is because the lattice mismatch between the m-plane sapphire and $Ga_2O_3$ is large, so an amorphous $(GaLu)_2O_3$ thin film is grown on the m-plane sapphire. Since the bond energy of the Lu—O bond is greater than the Ga—O bond, the introduction of Lu will greatly reduce the oxygen vacancy in the film and speed up the response speed of the device; at the same time, there are many dangling bonds and surface states in the amorphous $(GaLu)_2O_3$ film, which serve as recombination centers to further accelerate the response speed of the device. And from the wavelength-responsivity curve of the solar-blind ultraviolet photodetector based on the amorphous $(GaLu)_2O_3$ film prepared in this example, it can be seen that the peak response wavelength (235 nm) of the amorphous $(GaLu)_2O_3$-based photodetector is blue shifted compared with the photodetector in Comparative Example 1 due to the relatively wider band gap of $(GaLu)_2O_3$. In summary, compared with the pure $Ga_2O_3$ thin film-based photodetector of Comparative Example 1, the amorphous $(GaLu)_2O_3$-based photodetector has a lower dark current, significantly faster recovery speed, a shorter peak response wavelength, and a larger photo-dark current ratio ($I_{light}/I_{dark}$=7.34×10$^4$) and higher detection rate (D*=8× 10$^{14}$), showing a more sensitive and faster detection ability for solar-blind ultraviolet light.

Example 14

A $(GaLu)_2O_3$ ternary alloy material of this embodiment is made of $Ga_2O_3$ powder and $Lu_2O_3$ powder with a molar ratio of 70:30 by solid phase sintering. The method is the same as that of Example 1.

The $(GaLu)_2O_3$ ternary alloy material described above in this embodiment is used to prepare a solar-blind ultraviolet photodetector. A solar-blind ultraviolet photodetector based on $(GaLu)_2O_3$ ternary alloy in this embodiment includes an m-plane sapphire substrate, an active layer, and a pair of parallel metal electrodes in sequence from bottom to top, where: The active layer is an amorphous $(GaLu)_2O_3$ ternary alloy film. The amorphous $(GaLu)_2O_3$ ternary alloy film is deposited using the $(GaLu)_2O_3$ ternary alloy material; the parallel metal electrode material is Al, the thickness of the substrate is 0.43 mm, the thickness of the active layer is 150 nm, the thickness of the parallel metal Al electrode is 50 nm, and the spacing of the parallel metal Al electrodes is 50 μm.

The solar-blind photodetector based on $(GaLu)_2O_3$ ternary alloy in this embodiment is prepared by the following method, including the following steps:

2.1 Using the $(GaLu)_2O_3$ ternary alloy material described above as a laser ablation target in this embodiment, it was loaded into a vacuum chamber together with a sapphire substrate that was ultrasonically cleaned with acetone, absolute ethanol and deionized water, etc. for 15 minutes, and pump the chamber down to $10^{-4}$ Pa;

2.2 After the substrate temperature reaches 500° C., oxygen is introduced to maintain the gas pressure at 1 Pa during the entire film deposition process; then the substrate and the target are set to rotate, the laser output energy and pulse repetition frequency are set to 300 mJ/pulse and 5 Hz, respectively, and then the laser is turned on to start depositing $(GaLu)_2O_3$ ternary alloy thin film. After 30 minutes of deposition, the oxygen and heating were turned off, and finally the sample was naturally cooled to room temperature in a vacuum and taken out;

2.3 Place the obtained $(GaLu)_2O_3$ ternary alloy film on the mask plate and install it into the vacuum chamber of the vacuum evaporation machine, then install the tungsten boat and feed it with the evaporation source-metal Al 0.10 g, close the vacuum chamber, and start the mechanical pump, fore-stage valve, molecular pump, and pump the chamber to below $10^{-4}$ Pa. Then turn on the evaporation power, slowly increase the current until the metal Al melts, and then keep the current constant and open the baffle to start evaporation. After the evaporation of the metal Al is completed, the current is slowly reduced, the evaporation source is closed, the molecular pump, the fore-stage valve, and the mechanical pump are turned off, and then the air valve is opened to flow air into the chamber. Finally the solar-blind ultraviolet photodetector based on the (GaLu)$_2$O$_3$ ternary alloy is obtained.

Figure 22:
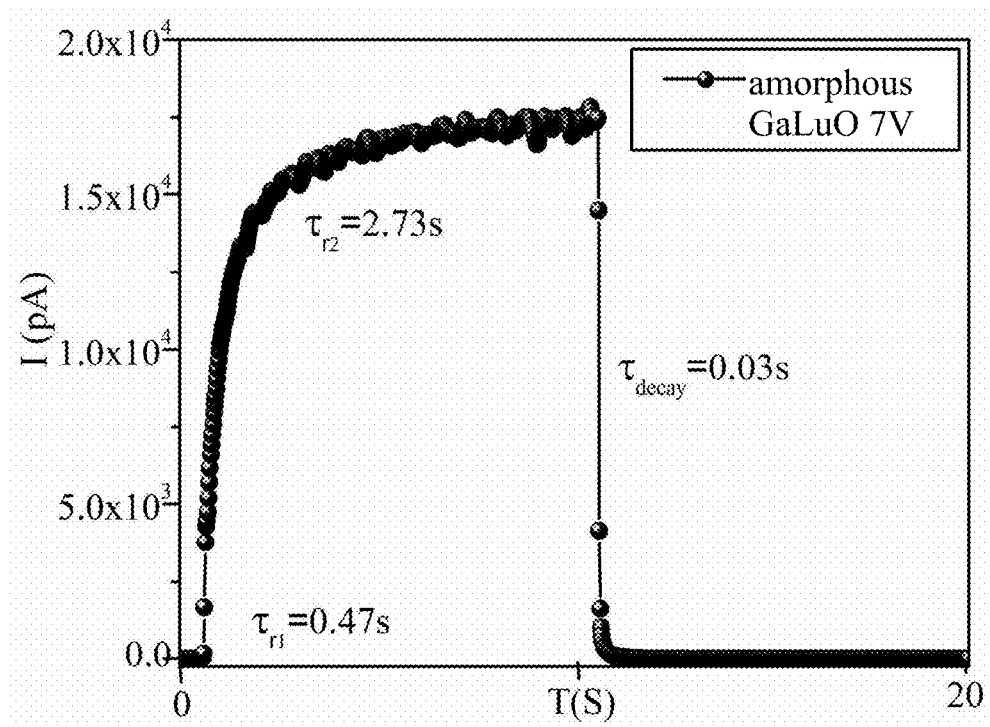
FIG. 22 is a graph of time t-current I response of a solar-blind ultraviolet photodetector based on (GaLu)₂O₃ ternary alloy in Example 14 of the present invention.

A voltage of 7 V was applied between the electrodes of the device prepared in this example while the surface of the sample was irradiated with monochromatic light to perform photoelectric performance tests. The test results show that the dark current of this device is extremely low ($I_{dark}$=0.2 pA), and the ratio of light to dark current is 9000. It can be seen that the device also exhibits better detection performance at lower bias voltages. The test results are shown in FIG. 22.

Comparative Example 1

A solar-blind UV photodetector based on Ga$_2$O$_3$ thin film of the present comparative example includes a c-plane sapphire substrate, an active layer, and a pair of parallel metal Au electrodes in sequence from bottom to top, wherein: the active layer is a Ga$_2$O$_3$ film, the thickness of the c-plane sapphire substrate is 0.43 mm, the thickness of the active layer is 150 nm, the thickness of the parallel metal Au electrode is 55 nm, and the spacing of the parallel metal Au electrodes is 10 μm.

The solar-blind UV photodetector based on Ga$_2$O$_3$ film mentioned above in this comparative example is prepared by the following method, including the following steps:

Step 1: Preparation of Ga$_2$O$_3$ Ceramic Target by Solid-Phase Sintering 1.1 Weigh 10 g of Ga$_2$O$_3$ powder, add 15 g of deionized water, and then put it in a ball milling tank (ball milling media are zirconia ceramic balls) in a planetary ball mill, and ball mill for 4 h to obtain a uniformly dispersed powder;

1.2 Using the same processing steps of step 1.2 and step 1.3 of Example 1, the obtained powder is made into the Ga$_2$O$_3$ ceramic target.

Step 2 Use Ga$_2$O$_3$ Ceramic Target to Prepare Solar-Blind UV Photodetector

The treatment process of step 2 of this comparative example is basically the same as that of step 2 of example 1, except that the laser ablation target in this comparative example uses Ga$_2$O$_3$ ceramics.

Figure 23:
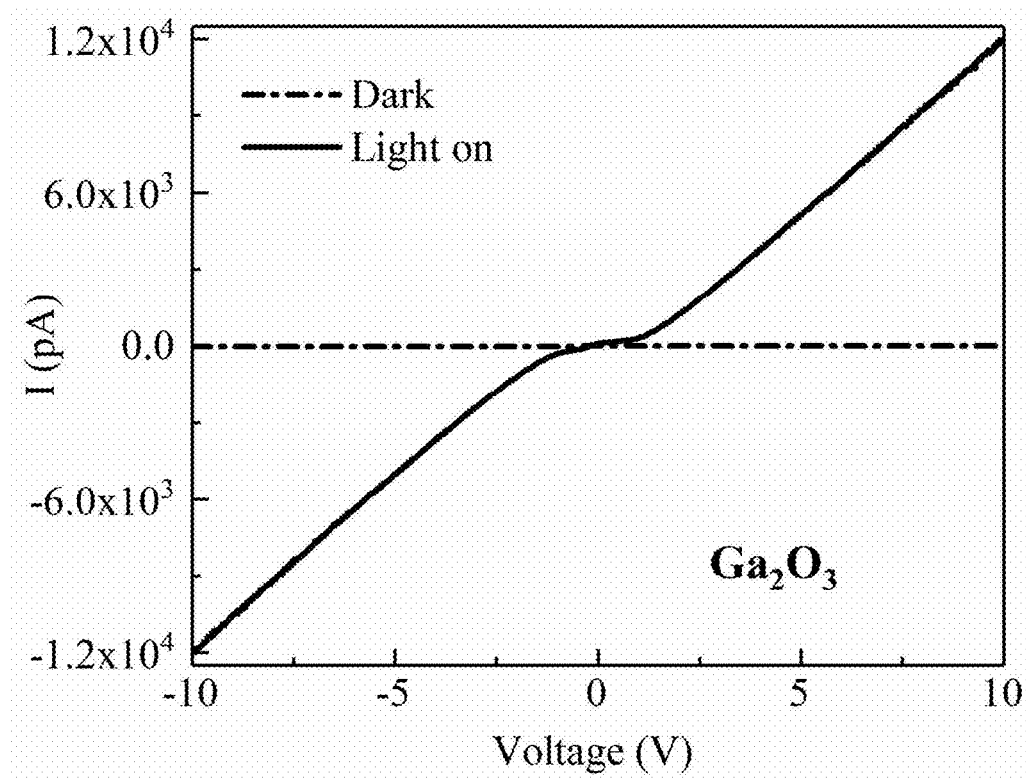
FIG. 23 is an I-V curve of a pure Ga₂O₃ based solar-blind ultraviolet photodetector in Comparative Example 1 of the present invention.
Figure 24:
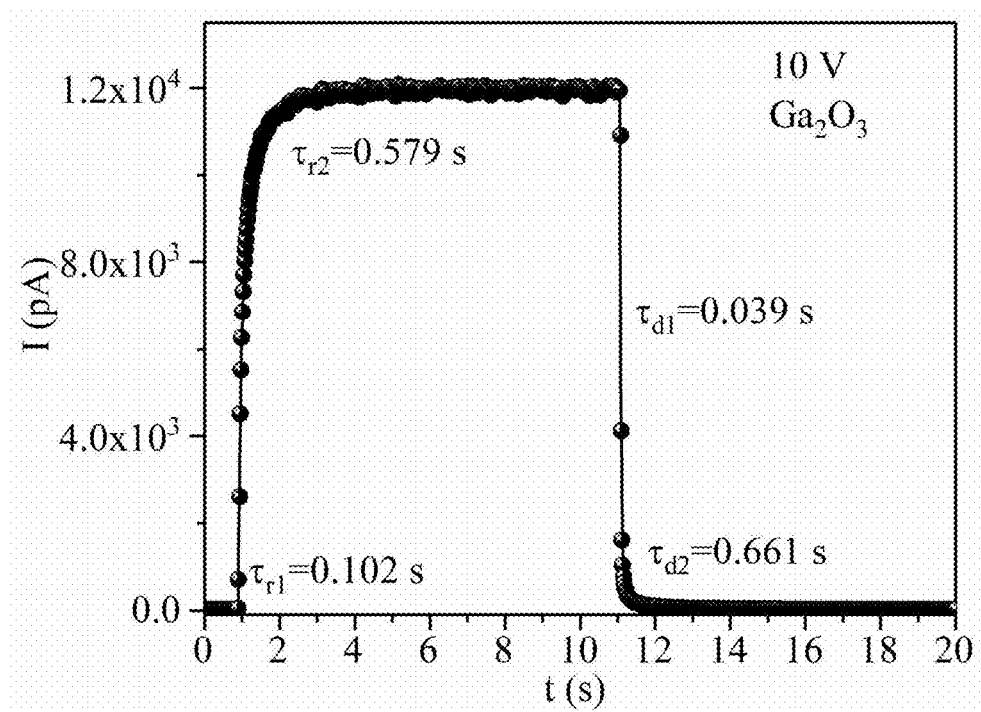
FIG. 24 is a graph of time t-current I response of the pure Ga₂O₃ based solar-blind ultraviolet photodetector in Comparative Example 1 of the present invention.

A voltage of 10 V was applied between the electrodes of the device prepared in this comparative example while the surface of the sample was irradiated with monochromatic light for photoelectric performance testing. The results show that the dark current of the device is $I_{dark}$=10.6 pA, the relaxation response times $\tau_{r2}$ and $\tau_{d2}$ are 0.579 s and 0.661 s, respectively, and the peak response Rmax=20.9 A/W. The test results are shown in FIG. 23, FIG. 24, and FIG. 26, respectively. It can be seen that the dark current of the device made in this comparative example is obviously higher than that of the (GaMe)$_2$O$_3$-based photodetector, and the response speed is slower. Comparing with this comparative example, the (GaMe)$_2$O$_3$-based photodetector of the present invention has significantly better solar-blind ultraviolet light detection capability.

One skilled in the art will understand that the embodiment of the present invention as shown in the drawings and described above is exemplary only and not intended to be limiting.

It will thus be seen that the objects of the present invention have been fully and effectively accomplished. Its embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A (GaMe)$_2$O$_3$ ternary alloy material, comprising solid solutions of Ga$_2$O$_3$ and Me$_2$O$_3$ with a molar ratio of 99:1 to 50:50, wherein Me is one element selected from Lu, Sc and Y.

2. The (GaMe)$_2$O$_3$ ternary alloy material, as recited in claim 1, wherein a molar ratio of the Ga$_2$O$_3$:Me$_2$O$_3$ is at a range of 95:5 to 70:30.

3. A method for preparing the (GaMe)$_2$O$_3$ ternary alloy material, as recited in claim 1, specifically comprising steps of:

(A) weighing powders of the Ga$_2$O$_3$ and Me$_2$O$_3$ with the molar ratio, placing the powders in a ball milling tank, adding deionized water and performing ball milling to obtain a uniformly mixed powder;

(B) screening the uniformly mixed powder solution in step (A) to remove milling zirconia balls and placing the uniformly mixed powder solution in a vacuum drying oven, after drying, cooling to room temperature, then crushing and pressing into a wafer; and (C) in an air atmosphere, placing the wafer obtained in step (B) in a vacuum tube furnace and sintering at 1000 to 1500° C. for 1 to 4 hours to obtain the (GaMe)$_2$O$_3$ ternary alloy material.

4. A method for preparing a solar-blind ultraviolet photodetector comprising the (GaMe)$_2$O$_3$ ternary alloy material as recited in claim 1.

* * * * *